US008692758B2

(12) United States Patent
Matsuda et al.

(10) Patent No.: US 8,692,758 B2
(45) Date of Patent: Apr. 8, 2014

(54) DISPLAY DEVICE AND MOBILE TERMINAL USING SERIAL DATA TRANSMISSION

(75) Inventors: Noboru Matsuda, Osaka (JP); Isao Takahashi, Osaka (JP); Takahiro Yamaguchi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 676 days.

(21) Appl. No.: 12/735,494

(22) PCT Filed: Jan. 29, 2009

(86) PCT No.: PCT/JP2009/051472

§ 371 (c)(1),
(2), (4) Date: Jul. 21, 2010

(87) PCT Pub. No.: WO2009/128283

PCT Pub. Date: Oct. 22, 2009

(65) Prior Publication Data

US 2010/0295841 A1 Nov. 25, 2010

(30) Foreign Application Priority Data

Apr. 18, 2008 (JP) ................................ 2008-109442

(51) Int. Cl.
*G09G 3/36* (2006.01)
*G09G 5/00* (2006.01)
*G11C 19/00* (2006.01)

(52) U.S. Cl.
USPC ............... 345/99; 345/100; 345/213; 377/70; 377/78

(58) Field of Classification Search
USPC ........... 345/79, 87–92, 96, 98–100, 204, 209, 345/211–215, 690; 377/64–81
See application file for complete search history.

(56) References Cited

U.S. PATENT DOCUMENTS 5,343,557 A * 8/1994 Kiel et al. ..................... 345/418
5,742,269 A 4/1998 Hayashiguchi et al.

(Continued)

FOREIGN PATENT DOCUMENTS

EP 1306827 5/2003
JP 58-23091 2/1983

(Continued)

OTHER PUBLICATIONS

Russian Notice of Allowance with English translation for Russian Application No. 2010138607 dated Sep. 20, 2011.

(Continued)

*Primary Examiner* — Bipin Shalwala
*Assistant Examiner* — Keith Crawley
(74) *Attorney, Agent, or Firm* — Harness, Dickey & Pierce, P.L.C.

(57) ABSTRACT

A display device of an embodiment of the present invention is a display device of an active matrix type, and includes a display driver supplied with image data included in serial data by serial transmission. The serial data has a first flag for specifying a polarity of voltage of a common electrode added thereto. The display driver generates, in accordance with a timing of a serial clock, a timing signal for a horizontal period for a data signal line driver, and a timing signal for a gate signal line driver. This realizes a display device capable of easily generating, within a driver IC, a timing signal for writing the image data in pixels.

14 Claims, 15 Drawing Sheets

(56) References Cited

U.S. PATENT DOCUMENTS

| | | | | |
|---|---|---|---|---|
| 6,373,458 | B1 | 4/2002 | Yamakura et al. | |
| 2002/0097208 | A1 | 7/2002 | Hashimoto | |
| 2002/0140713 | A1 | 10/2002 | Klompenhouwer et al. | |
| 2002/0180719 | A1 | 12/2002 | Nagai et al. | |
| 2003/0001808 | A1 | 1/2003 | Sakuma et al. | |
| 2003/0090500 | A1 | 5/2003 | Yamazaki | |
| 2003/0174145 | A1 | 9/2003 | Lyapunov et al. | |
| 2005/0046647 | A1 | 3/2005 | Lee | |
| 2005/0225548 | A1 | 10/2005 | Han et al. | |
| 2006/0050034 | A1 | 3/2006 | Choi | |
| 2006/0132420 | A1 | 6/2006 | Yoshida et al. | |
| 2007/0101028 | A1 * | 5/2007 | Tokunaga et al. | 710/52 |
| 2008/0007508 | A1 * | 1/2008 | Yoneyama | 345/100 |
| 2008/0225036 | A1 * | 9/2008 | Song et al. | 345/213 |
| 2009/0051675 | A1 * | 2/2009 | Huang | 345/204 |

FOREIGN PATENT DOCUMENTS

| | | | |
|---|---|---|---|
| JP | 2003-015613 | | 1/2003 |
| JP | 2003-177717 | | 6/2003 |
| JP | 2003-208136 | | 7/2003 |
| JP | 2006-119409 | | 5/2006 |
| JP | 2007-114695 | | 5/2007 |
| JP | 2007-133263 | | 5/2007 |
| JP | 2007-286237 | | 11/2007 |
| RU | 2015576 | | 6/1994 |
| RU | 2206914 | C2 | 6/2003 |
| RU | 2003131333 | A | 4/2005 |
| RU | 2312404 | C2 | 12/2007 |
| WO | WO 02/11116 | | 2/2002 |
| WO | WO 2007/046731 | | 4/2007 |

OTHER PUBLICATIONS

European Search Report dated Jul. 20, 2012.

Lawrence, R., "High-speed serial interface for mobile displays," Proceedings of the 13$^{th}$ International Display Workshops, vol. 3, pp. 2013-2016, Dec. 6-8, 2006.

MIPI Alliance, "MIPI Alliance Standard for Display Serial Interface V1.0," Apr. 5, 2011.

MIPI Alliance, "MIPI Alliance Standard for Display Command Set," Mar. 7, 2012.

International Search Report for PCT/JP2009/051472.

International Search Report for PCT/JP2009/050689.

U.S. Office Action mailed Oct. 16, 2013 for corresponding U.S. Appl. No. 12/735,701.

U.S. Office Action mailed May 30, 2013 for corresponding U.S. Appl. No. 12/735,701.

U.S. Advisory Action mailed Feb. 5, 2014 for corresponding U.S. Appl. No. 12/735,701.

* cited by examiner

DISPLAY DEVICE AND MOBILE TERMINAL USING SERIAL DATA TRANSMISSION

TECHNICAL FIELD

The present invention relates to a timing signal used for a display operation of a display device.

BACKGROUND ART

There has been known a display device that includes a memory circuit (hereinafter referred to as a pixel memory) in each pixel and stores image data in the pixel memory so as to display a static image with low power consumption without being continuously supplied with image data from the outside. The power consumption is reduced by e.g., (i) an amount of power for charging and discharging, by image data, data signal lines for supplying the image data to the pixels and (ii) an amount of power for transmitting image data from the outside of a panel to a driver. The amount (i) is reduced because such the charge or discharge is no longer necessary once the image data is written into the pixel memory, and the amount (ii) is reduced because such the transmission is no longer necessary once the image data is written into the pixel memory.

SRAM-based and DRAM-based pixel memories have been developed. A pixel voltage of a display device having the SRAM-based or DRAM-based pixel memory is digital. Therefore, such the display device hardly causes crosstalk, and has excellent display quality.

FIG. 14 shows a configuration of a display device including such a pixel memory described in Patent Literature 1.

The display device includes an X address scanning line driver 18, a digital data driver 19, and an analog data driver 20, and can perform a digital data image display mode and an analog data image display mode separately.

The following will describe the digital data image display mode. An X address signal line 4-*n* (n is a positive integer) connected with a pixel where image data is to be written is selected. Then, from its corresponding first display control line 1-*n*, a digital data signal is written into a digital memory element 100 including a NAND circuit 11 and a clocked inverter element 13, through a first switch element 8 of the pixel. At this time, the digital memory element 100 is made active via a display mode control line 15.

An input of the digital memory element 100 is connected to a second switch element 9, and an output of the digital memory element 100 is connected to a third switch element 10. Therefore, depending on High or Low of the digital data signal, either the second switch element 9 or the third switch element 10 becomes conductive. A white display reference voltage is supplied to one of a second display control line 2-*n* and a third display control line 3, and a black display reference voltage is supplied to the other one of the second display control line 2-*n* and the third display control line 3. Depending on the switch element which has become conductive, the second switch element 9 or the third switch element 10, the white display voltage or black display voltage is selected, and then is applied to a liquid crystal cell 6. The liquid crystal cell 6 maintains a display state caused by the digital data signal stored in the digital memory element 100, until the first switch element 8 becomes conductive again and another digital data signal is written into the digital memory element 100.

Patent Literature 1

Japanese Patent Application Publication, Tokukai, No. 2003-177717 A (Publication Date: Jun. 27, 2003)

Patent Literature 2

Japanese Patent Application Publication, Tokukaisho, No. 58-23091 A (Publication Date: Feb. 10, 1983)

Patent Literature 3

Japanese Patent Application Publication, Tokukai, No. 2007-286237 A (Publication Date: Nov. 1, 2007)

SUMMARY OF INVENTION

Recently, more and more interfaces for display data transmission for use in liquid crystal display devices employ a high-speed serial transmission method using less signal lines, instead of a digital RGB method (RGB interface) of a parallel transmission method using many signal lines. The technique of the serial transmission method is important particularly for a mobile device such as a mobile phone, since the mobile device needs to reduce a space for disposing wiring and to prevent disconnection of the wire. Further, performing differential transmission enables high-speed transmission with low power consumption. In such the serial transmission, display data and a control command are transmitted through the same bus.

For example, according to the MIPI (Mobile Industry Processor Interface) standards that prescribe common specifications for a so-called CPU interface, which is an interface between an application processor and a peripheral device of a mobile device, the application processor functions as a host to control operation of the peripheral device. A display drive device which uses a control signal usually starts display operation as defined by a command control. Such the display drive device starts screen display in response to a start-up command transmitted to the display drive device from the host after power source is activated.

FIG. 15 is a view schematically showing a circuit connection configuration of a mobile phone including a liquid crystal display section provided with such a CPU interface.

A mobile phone 101 includes a liquid crystal display section 102, a liquid crystal driver 103, an antenna 104, an RF circuit 105, a baseband processor 106, and an application processor 107.

The liquid crystal display section 102 has pixels disposed in a matrix. Data signals are respectively written into the pixels via their corresponding source bus lines SL1 to SLn. The data signals are supplied to the source bus lines SL1 to SLn from the liquid crystal driver 103. Further, scanning signals each selecting a line including a plurality of pixels are supplied to gate bus lines from the liquid crystal driver 103 in order so that the data signals are written into the pixels (this operation is not shown).

The liquid crystal driver 103 is a circuit which controls display of the liquid crystal display section 102 including one or more chips. Further, the liquid crystal driver 103 includes circuit sections such as a timing generator, a source driver, a gate driver, a power circuit, and a memory, each of which relates to display operation. Furthermore, the liquid crystal driver 103 is controlled by the application processor 107, serving as a host, via a serial bus I/F BUS, and includes an interface thereof.

The antenna 104 is an antenna that the mobile phone 101 uses for transmission and reception. The RF circuit 105 processes a radio frequency signal in the transmission and the reception. The baseband processor 106 processes a baseband signal demodulated by the RF circuit 105, and controls operation of a talking signal processing circuit (not shown) and a data communication processing circuit (not shown). The application processor 107 controls the liquid crystal driver 103 and a peripheral device (not shown) which processes a moving image, music, a video game, and/or the like.

FIG. 16 shows an example of a structure of the liquid crystal driver 103.

In the liquid crystal driver 103, a serial interface 131 receives a control command and display data supplied from the serial interface bus I/F BUS, and the control command is written into a register 132. In accordance with a timing at which the control command and the display data are received, a timing generator 135 generates a timing signal by use of an oscillator included in the timing generator 135. In accordance with the timing signal, the display data is transmitted from the serial interface 131 to a shift register 133, and then to a source drive circuit 134 in this order, so that the data signal is supplied to the source line SL.

In order to drive each part of a driver and a liquid crystal display section, in a case of an RGB interface, a vertical sync signal and a horizontal sync signal are supplied from the outside; however, in a case of the liquid crystal driver including the above-described CPU interface, instead of the vertical sync signal or the horizontal sync signal, the timing generator all the way generates a timing signal by use of free running oscillator in accordance with the control command and the display data which are supplied by serial transmission. In the case of the pixel including the above-described pixel memory, display of a static image is performed as follows: After the display data is written into the memory circuit, supply of data from the application processor is stopped so that power consumption is reduced. Therefore, generating a timing signal in the liquid crystal driver is important. That is, although the liquid crystal driver including the above-described CPU interface employs the serial transmission that has advantages of enabling reduction in size, high-speed transmission, and low power consumption, a timing signal for writing image data into a pixel should be generated in accordance with the clock signal generated by the timing generator.

Thus, with the conventional CPU interface method, it is necessary to all the way generate, within a driver IC, a timing signal for writing image data into pixels with use of an oscillator or the like in accordance with a signal supplied from the CPU. This prevents reduction in size of a circuit of the liquid crystal driver.

The present invention was made in view of the foregoing problem, and an object of the present invention is to realize a display device capable of easily generating, within a driver IC, a timing signal for writing image data into pixels, and a mobile terminal including the display device.

A display device of the present invention, to attain the object, is a display device of an active matrix type, and includes a display driver which is supplied with image data included in serial data by serial transmission, the serial data has a first flag for indicating start of one frame period added thereto, the display driver extracts the first flag and the image data from the serial data in accordance with a timing of a serial clock transmitted through a wire used for the serial transmission but different from a wire for the serial data, in accordance with a timing of the serial clock, the display driver generates a timing signal serving as a clock signal for operating a shift register of a data signal line driver included in the display driver, in accordance with the first flag and the timing signal serving as the clock signal for operating the shift register, the display driver generates a timing signal for an initial horizontal period in one frame period, and inputs the timing signal for the initial horizontal period to the shift register of the data signal line driver, in a case where a subsequent horizontal period exists, the display driver generates a timing signal for the subsequent horizontal period in accordance with a signal shifted by one horizontal display period by means of the shift register of the data signal line driver, and inputs the timing signal for the subsequent horizontal period to the shift register of the data signal line driver, in accordance with the signal shifted by one horizontal display period by means of the shift register of the data signal line driver, the display driver generates a timing signal to be inputted to a shift register of a scanning signal line driver included in the display driver, and in accordance with the timing signals for the initial horizontal period and the subsequent horizontal period, and a scanning signal supplied by the scanning signal line driver, the display driver writes the image data into pixels.

According to the above invention, the display driver extracts, in accordance with the timing of the serial clock, the first flag and the image data from the serial data supplied by the serial transmission. Then, the display driver generates the timing signal for the initial horizontal period in one frame period in accordance with the first flag, and inputs the timing signal to the shift register of the data signal line driver. The display driver sequentially generates timing signals for a second horizontal period and a subsequent horizontal period in accordance with the signal shifted by one horizontal display period by means of the shift register of the data signal line driver.

Thus, the display driver can generate, by direct control of the serial transmission, a timing signal for writing image data into a pixel. That is, the display driver can easily generate the timing signal without all the way using an oscillator and the like.

The above configuration makes it possible to easily generate, within a driver IC, a timing signal for writing image data into a pixel.

In the display device of the present invention, to attain the object, each of the pixels includes a pixel memory for storing the image data supplied by the display driver; in a case where the pixel memory stores the image data, the serial data includes the image data to be stored in the pixel memory, and the serial data has the first flag added thereto; and in a case where the image data stored in the pixel memory is displayed, the serial data includes, instead of the image data to be stored in the pixel memory, dummy data not to be supplied to the pixels, and the serial data has the first flag added thereto.

According to the foregoing invention, in the case where the image data stored in the pixel memory is displayed, the first flag is added to, instead of the image data to be stored in the pixel memory, the dummy data not to be supplied to the pixels. This first flag makes it possible to generate a timing signal for AC common voltage while power is not consumed for supply of the image data to each of the pixels.

In the display device of the present invention, to attain the object, the scanning signal is a signal which enables the image data to be written into the pixel memory after all of the image data are outputted to a data signal line in each horizontal display period.

According to the foregoing invention, in each horizontal display period, the image data are written into the pixel memory after all of the image data are outputted to data signal line. Therefore, even if fluctuation occurs in electric potential of the data signal line in a period in which the image data are outputted to the data signal line in order, this gives less effects on the pixel memory in storing the image data.

In the display device of the present invention, to attain the object, the serial data has a second flag indicating whether or not the serial data includes the image data to be stored in a pixel memory added thereto; and the display driver extracts the second flag from the serial data in accordance with a timing of the serial clock, and in a case where the second flag indicates that the serial data includes the image data to be stored in the pixel memory, the display driver extracts the image data from the serial data and stores the image data in the pixel memory.

According to the foregoing invention, it is possible to know, from the second flag, that the serial data includes the image data to be stored in the pixel memory. With this, only when the serial data includes the image data, power consumption for supply of the image data to each of the pixels is permitted.

In the display device of the present invention, to attain the object, the serial data has a third flag giving an instruction as to whether to initialize display of all of the pixels added thereto; and the display driver extracts the third flag from the serial data in accordance with a timing of the serial clock, and in a case where the instruction of the third flag is for initializing the display of all of the pixels, the display driver initializes the display of all of the pixels.

According to the foregoing invention, it is possible to know, from the third flag, that display of all of the pixels is to be initialized. With this, it is possible to perform initialization without incorporating image data for initialization into the serial data. This eliminates the need for supplying the image data to the pixels individually, thereby leading to reduction in power consumption by an amount of power for supplying the image data to the pixels individually.

The display device of the present invention is a display device as set forth in claim 1 or 2 wherein the first flag, added to the serial data, serves as a flag for further specifying a polarity of voltage of a common electrode.

The foregoing invention makes it possible to invert the polarity of the voltage of the common electrode every frame. In the display device of the present invention, to attain the object, in the serial transmission, a serial chip select signal indicating whether to perform display, that is, whether to operate the display driver, is transmitted through a wire different from the wires for the serial data and the serial clock.

According to the foregoing invention, by recognizing, from the serial chip select signal, a period in which the display driver does not operate, the display driver can avoid loading the serial data. Therefore, it is possible to stop the serial transmission in this period, thereby leading to reduction in power consumption by an amount of power for the serial transmission.

In the display device of the present invention, to attain the object, the pixels each include an analog switch made of a CMOS circuit.

According to the foregoing invention, the analog switch in the pixel is made of the CMOS circuit. This makes it possible to drive, with a low voltage, even a device (e.g., a TFT) having a high Vth (threshold), and to set the same voltage for the control signal and the data signal. With this, it is possible to reduce a voltage amplitude of a power source used in a drive circuit for display, thereby reducing power consumption.

In the display device of the present invention, to attain the object, the display driver is monolithically provided in a display panel.

According to the foregoing invention, the display driver, made of the CMOS circuit, is monolithically formed on the display panel. This makes it possible to reduce the size of the display device and simplify a process.

In the display device of the present invention, to attain the object, the pixels each include a display element using polymer dispersed liquid crystal.

According to the foregoing invention, the polymer dispersed liquid crystal is used for the display element. With this, it is possible to realize a high-brightness liquid crystal display device omitting a polarizing plate and/or the like, and further to drive such the liquid crystal display device with a low voltage. This greatly reduces power consumption, particularly in a low-power-consumption display device including a pixel memory in a pixel.

In the display device of the present invention, to attain the object, the pixels each include a display element using polymer network liquid crystal.

According to the foregoing invention, the polymer network liquid crystal is used for the display element. With this, it is possible to realize a high-brightness liquid crystal display device omitting a polarizing plate and/or the like, and further to drive such the liquid crystal display device with a low voltage. This greatly reduces power consumption, particularly in a low-power-consumption display device including a pixel memory in a pixel.

In the display device of the present invention, to attain the object, the signal shifted by one horizontal display period by means of the shift register of the data signal line driver is shifted by a predetermined number of stages by use of a dummy shift register so that a first end bit is generated, and the first end bit is further shifted by one stage by means of the dummy shift register so that a second end bit is generated, the second end bit is used to generate the timing signal for the subsequent horizontal period for the data signal line driver, and the first end bit and the second end bit are used to generate the timing signal to be inputted to the shift register of the scanning signal line driver.

A mobile terminal of the present invention, to attain the object, includes the display device serving as a display module.

With the foregoing invention, it is possible to easily meet the demand for mobile terminals with lower power consumption.

For a fuller understanding of the nature and advantages of the invention, reference should be made to the ensuing detailed description taken in conjunction with the accompanying drawings.

BRIEF DESCRIPTION OF DRAWINGS

FIG. 1, related to an embodiment of the present invention, is a circuit block diagram showing how main parts of a display device are connected with each other.

FIG. 2 is a timing chart showing a waveform of each signal for serial transmission in a data update mode.

FIG. 3 is a timing chart showing a waveform of each signal for serial transmission in a display mode.

FIG. 4 is a block diagram showing a whole structure of a display device.

FIG. 5 is a circuit diagram showing a structure of a pixel and a pixel memory.

FIG. 6 is a timing chart showing an output waveform of a Vcom driver.

FIG. 7 is a circuit diagram showing a structure of a serial-parallel converter.

FIG. 8 is a circuit diagram showing a structure of an END-BIT holding section.

FIG. 9 is a circuit diagram showing a structure of a source start pulse generating section.

FIG. 10 is a circuit diagram showing a structure of a gate driver control signal generating section.

FIG. 11 is a circuit diagram showing a structure of a Vcom driver.

FIG. 12 is a timing chart showing a waveform of each signal of a serial-parallel converter.

FIG. 13 is a timing chart showing a waveform of each signal of a gate driver control signal generating section.

FIG. 14 is a circuit block diagram showing a structure of a display device of a conventional technique.

FIG. 15 is a block diagram showing a structure of a mobile phone of a conventional technique.

FIG. 16 is a block diagram showing a structure of a display driver of a conventional technique.

REFERENCE SIGNS LIST

21: Liquid Crystal Display Device (Display Device)
23: Binary Driver
23*a*: Shift Register (Shift Register of Data Signal Line Driver)
23*b*: Data Latch
24: Gate Driver
24*a*: Shift Register (Shift Register of Scanning Signal Line Driver)
25: Timing Generator
26: Vcom Driver
30: Pixel Memory
D0: Flag (Second Flag)
D1: Flag (First Flag)
D2: Flag (Third Flag)
GCK1B and GCKB2: Gate Clocks (Timing Signals Inputted to Shift Register of Gate Signal Line Driver)
GEN: Gate Enable Signal (Timing Signal Inputted to Shift Register of Gate Signal Line Driver)
SCK and SCKB: Source Clocks (Timing Signals as Clock Signals for Operating Shift Register of Data Signal Line Driver)
SSP: Source Start Pulse (Timing Signal for Horizontal Period)
I/F BUS: Serial Interface Bus
SI: Serial Data
SCLK: Serial Clock
SCS: Chip Select Signal
SL: Source Line (Data Signal Line)
Vcom: Common Output (Voltage of Common Electrode)

DESCRIPTION OF EMBODIMENTS

The following describes an embodiment of the present invention with reference to FIGS. 1 to 13.

Figure 4:
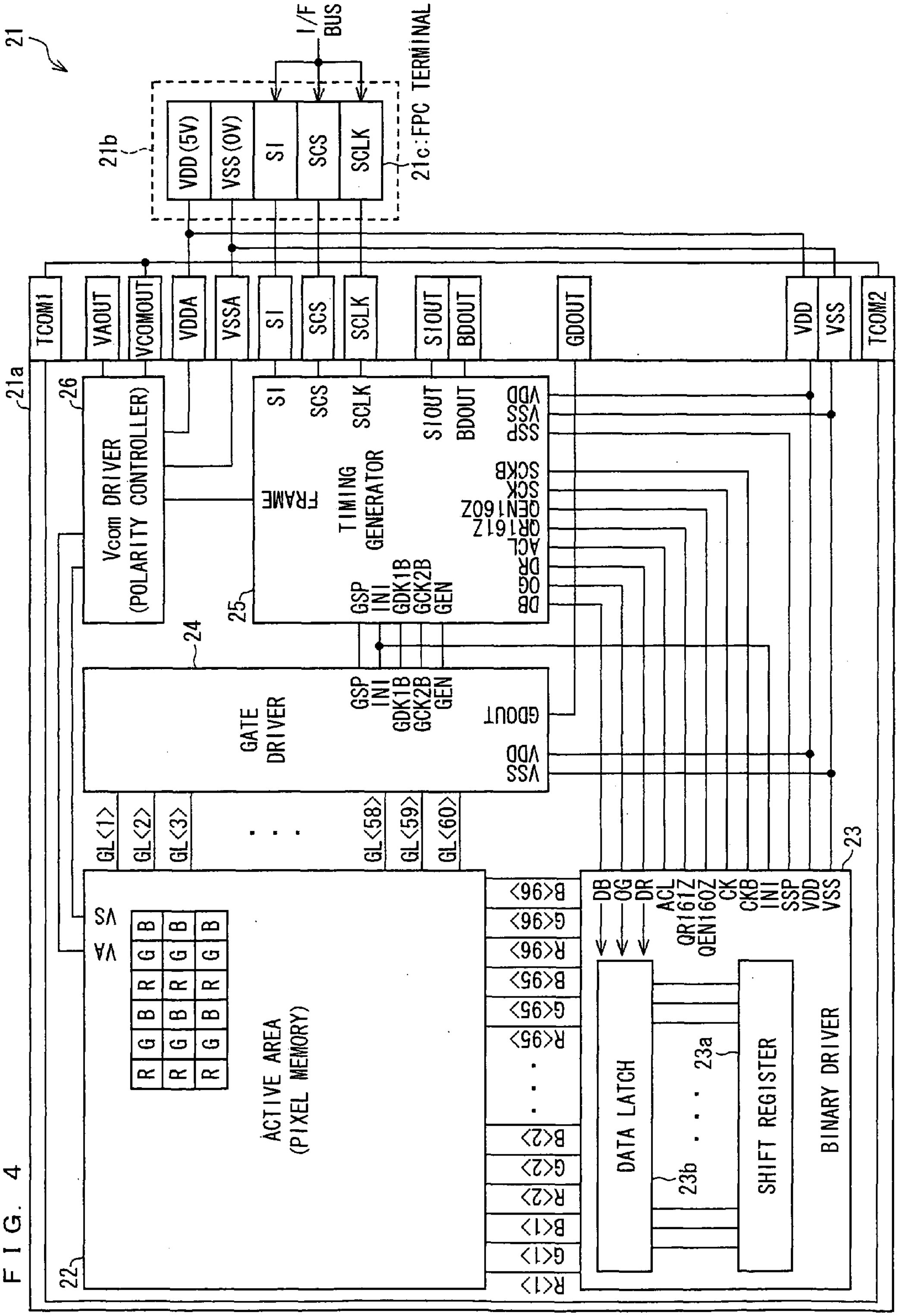
FIG. 4

FIG. 4 shows a structure of a liquid crystal display device (display device) 21 of the present embodiment.

The liquid crystal display device 21 is a display module included in a mobile terminal such as a mobile phone, and includes a display panel 21*a* and a flexible printed circuit (FPC) 21*b*. The display panel 21*a* has various circuits monolithically incorporated therein. The flexible printed circuit 21*b* receives serial data SI, a serial chip select signal SCS, and a serial clock SCLK supplied by serial transmission through a three-line serial interface bus I/F BUS that is controlled by a CPU such as an application processor, and supplies the serial data SI, the serial chip select signal SCS, and the serial clock SCLK to the display panel 21*a* through an FPC terminal 21*c*. The serial transmission may be controlled by other control means such as a micro controller.

Further, the flexible printed circuit 21*b* supplies 5V of power source VDD and 0V of power source VSS which are supplied from the outside, to the display panel 21*a* through the FPC terminal 21*c*.

The display panel 21*a* includes an active area 22, a binary driver (data signal line driver) 23, a gate driver (scanning signal line driver) 24, a timing generator 25, and a Vcom driver 26. The binary driver 23, the gate driver 24, the timing generator 25, and the Vcom driver 26 constitute a display driver.

The active area 22 is, for example, an area where RGB pixels are disposed in a matrix of 96×RGB×60, and each of the pixels includes a pixel memory. The binary driver 23 is a circuit for supplying image data to the active area 22 through a source line, and includes a shift register 23*a* and a data latch 23*b*. The gate driver 24 selects, through a gate line, a pixel to which image data is to be supplied, among the pixels in the active area 22. The timing generator 25 generates a signal to be supplied to the binary driver 23, the gate driver 24, and the Vcom driver 26, in accordance with a signal supplied from the flexible printed circuit 21*b*.

Figure 5:
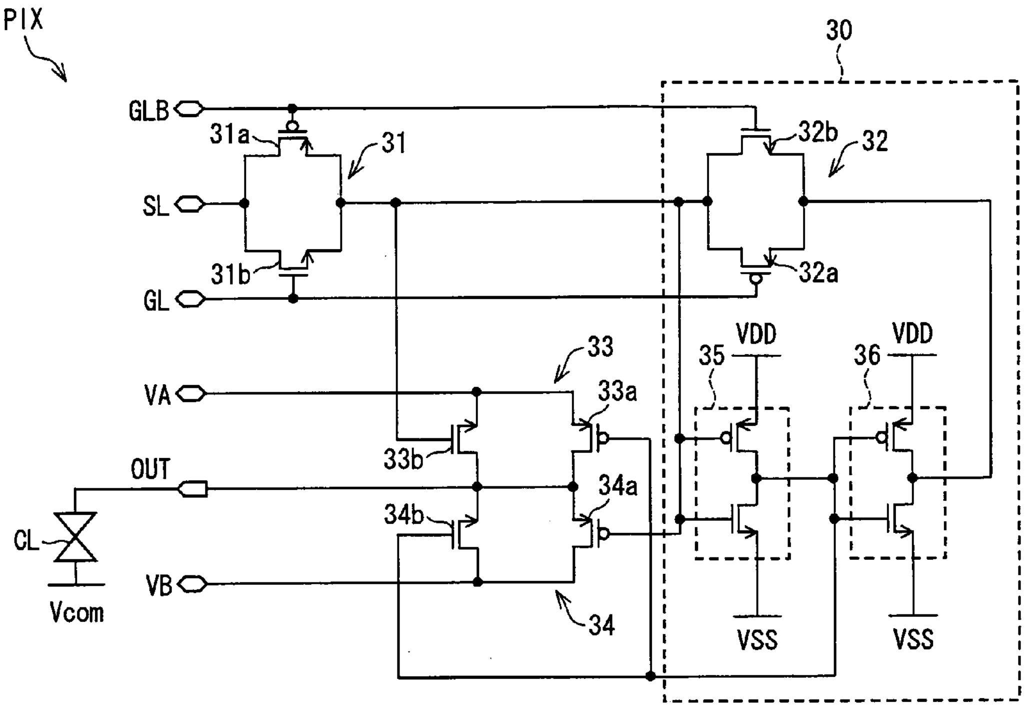
FIG. 5

FIG. 5 shows a structure of each of pixels PIX disposed in the active area 22 while showing a circuit of a pixel memory in detail.

The pixel PIX includes liquid crystal capacitance CL, a pixel memory 30, and analog switches 31, 33, and 34. The pixel memory 30 further includes an analog switch 32 and inverters 35 and 36.

The liquid crystal capacitance CL here is formed between a polarity output OUT and a common output Vcom (which is a voltage of a common electrode) with use of light dispersion type liquid crystal such as PDLC (Polymer Dispersed Liquid Crystal) or PNLC (Polymer Network Liquid Crystal). The analog switches 31 to 34 and the inverters 35 and 36 are each constituted by a CMOS circuit.

The analog switch 31 is disposed between a source line output SL and the pixel memory 30, and includes (i) a PMOS transistor 31*a* whose gate is connected to a gate line inversion output GLB and (ii) an NMOS transistor 31*b* whose gate is connected to a gate line output GL. The analog switch 32 of the pixel memory 30 is disposed between an input of the inverter 35 and an output of the inverter 36, and includes (i) a PMOS transistor 32*a* whose gate is connected to the gate line output GL and (ii) an NMOS transistor 32*b* whose gate is connected to the gate line inversion output GLB. The input of the inverter 35 is connected to a connection terminal of the analog switch 31 which connection terminal is on a side opposite to a side on which the source line output SL is connected. An output of the inverter 35 is connected to an input of the inverter 36. Each of the inverters 35 and 36 uses the power source VDD as a "High" power source and the power source VSS as a "Low" power source.

The analog switch 33 is disposed between a black polarity output VA and the polarity output OUT, and includes (i) a PMOS transistor 33*a* whose gate is connected to the output of the inverter 35 and (ii) an NMOS transistor 33*b* whose gate is connected to the input of the inverter 35. The analog switch 34 is disposed between a white polarity output VB and the polarity output OUT, and includes (i) a PMOS transistor 34*a* whose gate is connected to the input of the inverter 35 and (ii) an NMOS transistor 34*b* whose gate is connected to the output of the inverter 35.

Figure 6:
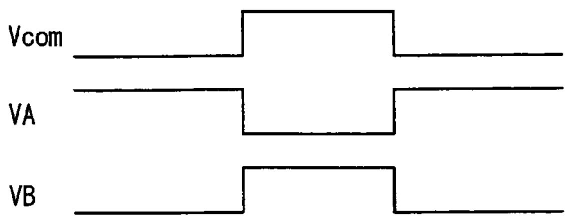
FIG. 6

FIG. 6 shows respective waveforms of the common output Vcom, the black polarity output VA, and the white polarity output VB. These signals are generated by the Vcom driver 26. The common output Vcom makes a 5 Vp-p pulse waveform in which switching between positive polarity and negative polarity occurs every frame. A cycle for the polarity switching can be optionally set. For example, such the switching may occur every predetermined horizontal period.

The black polarity output VA has a 5 Vp-p pulse waveform in anti-phase with that of the common output Vcom. The white polarity output VB (in a case of normally white) has a 5 Vp-p pulse waveform in in-phase with that of the common output Vcom.

In FIG. 5, in a case where High level (5V) is outputted as the source line output SL from the binary driver 23, a pixel PIX is selected by High level (5V) of the gate line output GL and Low level (0V) of the gate line inversion output GLB, so that an analog switch 31 of the pixel PIX selected becomes conductive. With this, the analog switch 33 becomes conductive and the analog switch 34 is blocked. Consequently, the black polarity output VA is outputted to the polarity output OUT, and the liquid crystal capacitance CL is supplied with 5V, which is a difference in voltage between the black polarity output VA and the common output Vcom. As a result, the pixel PIX is brought to a black display state.

Subsequently, when the gate line output GL becomes Low level (0V) and the gate line inversion output GLB becomes High level (5V), the analog switch 31 is blocked and the analog switch 32 becomes conductive. Consequently, High level is stored in the pixel memory 30. The stored data is retained until this pixel PIX is selected again and the analog switch 31 becomes conductive.

Meanwhile, in FIG. 5, in a case where Low level (0V) is outputted as the source line output SL from the binary driver 23, a pixel PIX is selected by High level (5V) of the gate line output GL and Low level (0V) of the gate line inversion output GLB, so that an analog switch 31 of the pixel PIX selected becomes conductive. With this, the analog switch 33 is blocked and the analog switch 34 becomes conductive. Consequently, the white polarity output VB is outputted to the polarity output OUT, and the liquid crystal capacitance CL is supplied with 0V, which is a difference in voltage between the white polarity output VB and the common output Vcom. As a result, the pixel PIX is brought to a white display state.

Subsequently, when the gate line output GL becomes Low level (0V) and the gate line inversion output GLB becomes High level (5V), the analog switch 31 is blocked and the analog switch 32 becomes conductive. Consequently, Low level is stored in the pixel memory 30. The stored data is retained until this pixel PIX is selected again and the analog switch 31 becomes conductive.

Figure 1:
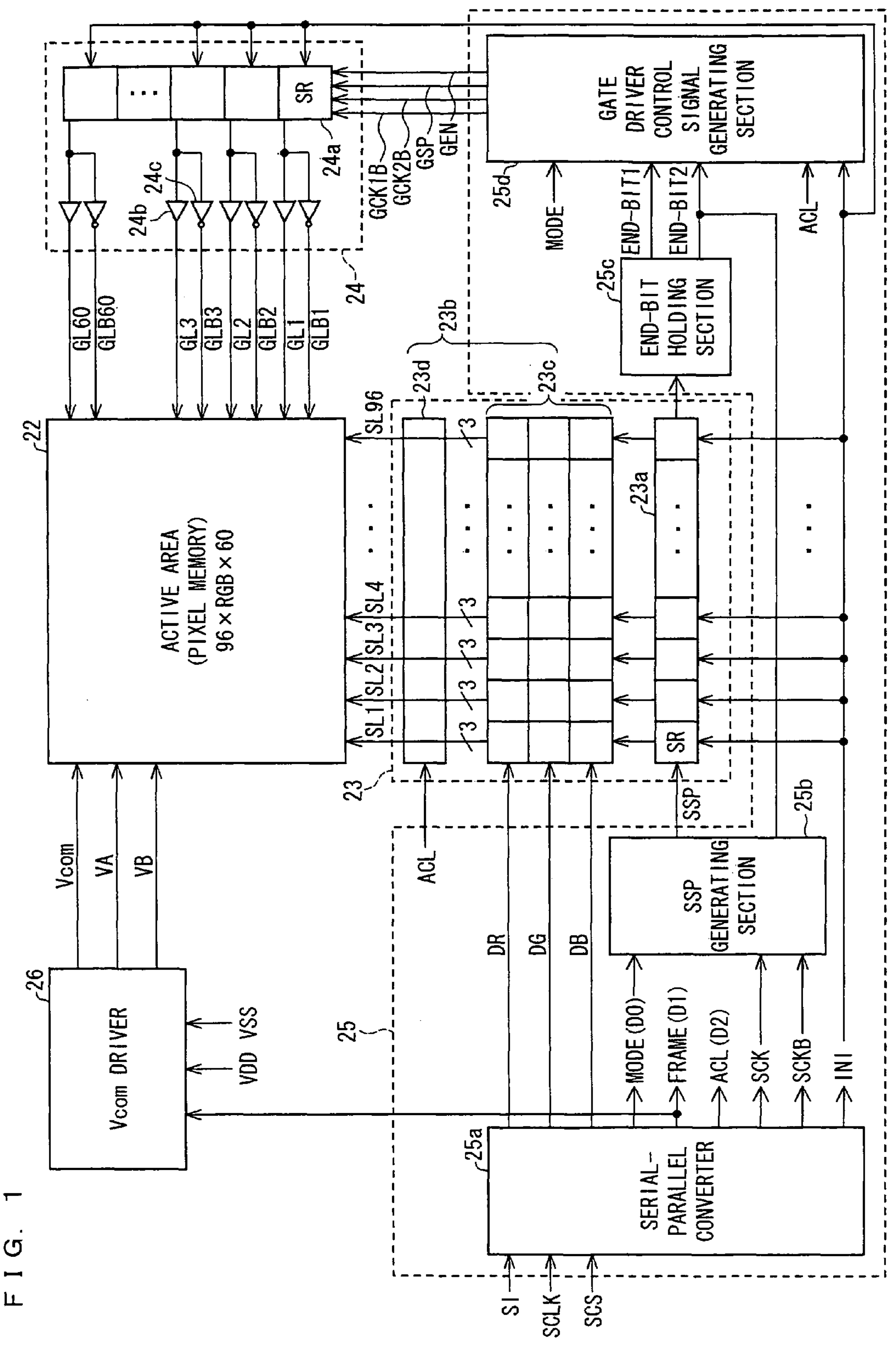
FIG. 1

FIG. 1 shows how the timing generator 25, the binary driver 23, the gate driver 24, and the Vcom driver 26 are connected with each other.

The timing generator 25 includes a serial-parallel converter 25*a*, a source start pulse generating section 25*b*, an END-BIT holding section 25*c*, and a gate driver control signal generating section 25*d*. The timing generator 25 generates a mode signal MODE, a frame signal FRAME, an all clear signal ACL, source clocks (timing signals each serving as a clock signal for operating the shift register of the data signal line driver) SCK and SCKB, a source start pulse (a timing signal for a horizontal period) SSP, gate clocks (timing signals each being inputted to the shift register of the gate signal line driver) GCK1B and GCK2B, a gate start pulse GSP, a gate enable signal (a timing signal inputted to the shift register of the gate signal line driver) GEN, and an initial signal INI, in accordance with serial data SI, a serial clock SCLK, and a serial chip select signal SCS which are supplied from the outside of the panel. The timing generator 25 supplies the source start pulse SSP and the initial signal INI to the binary driver 23. The timing generator 25 supplies the gate clocks GCK1B and GCK2B, the gate start pulse GSP, the gate enable signal GEN, and the initial signal INI to the gate driver 24. The timing generator 25 supplies the frame signal FRAME to the Vcom driver 26. The source clocks SCK and SCKB are used in the timing generator 25 here. However, as described later, the source clocks SCK and SCKB are used for generating the source start pulse SSP every horizontal period, and are clock signals for operating the shift register 23*a* of the binary driver 23.

Figure 2:
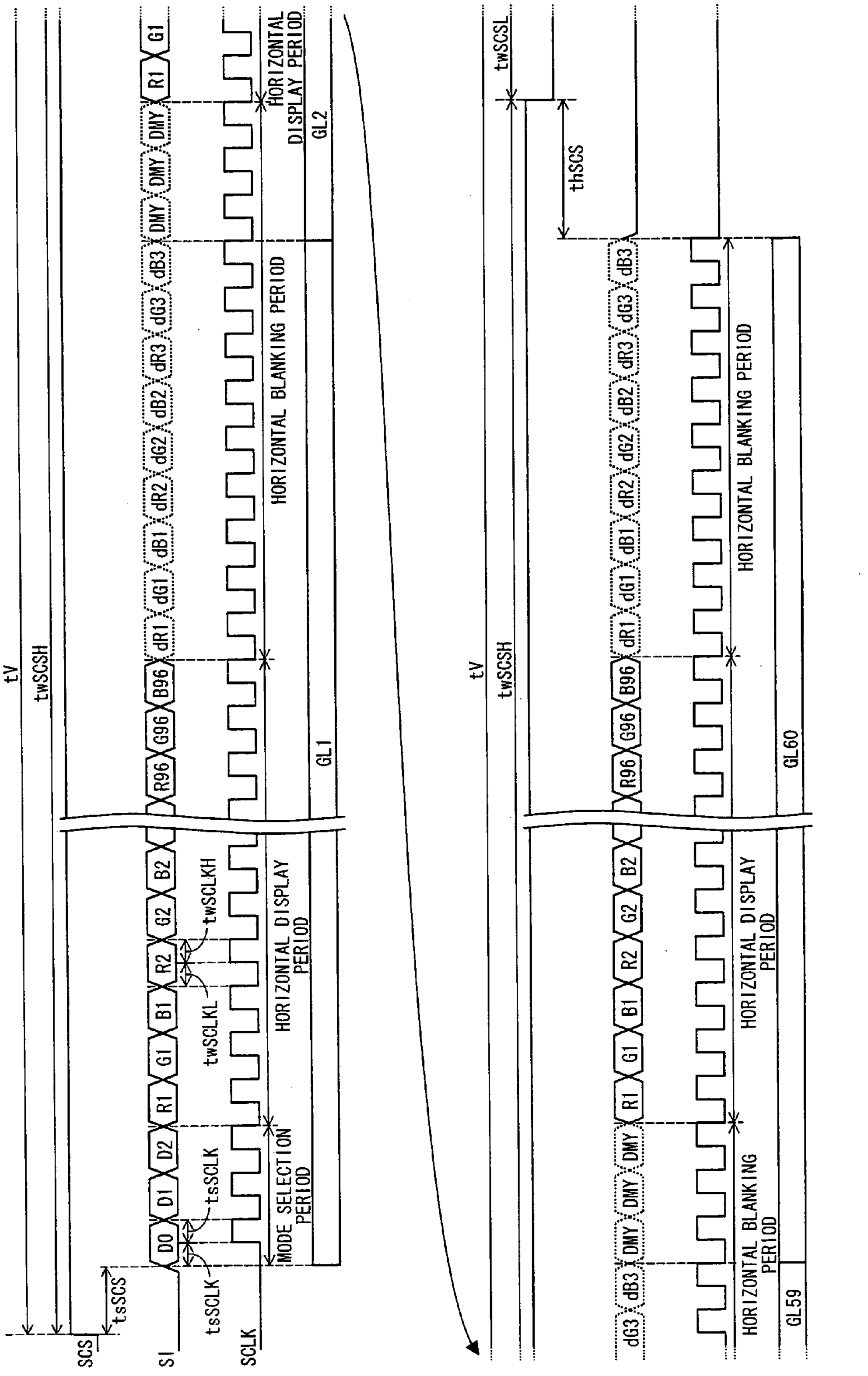
FIG. 2
Figure 3:
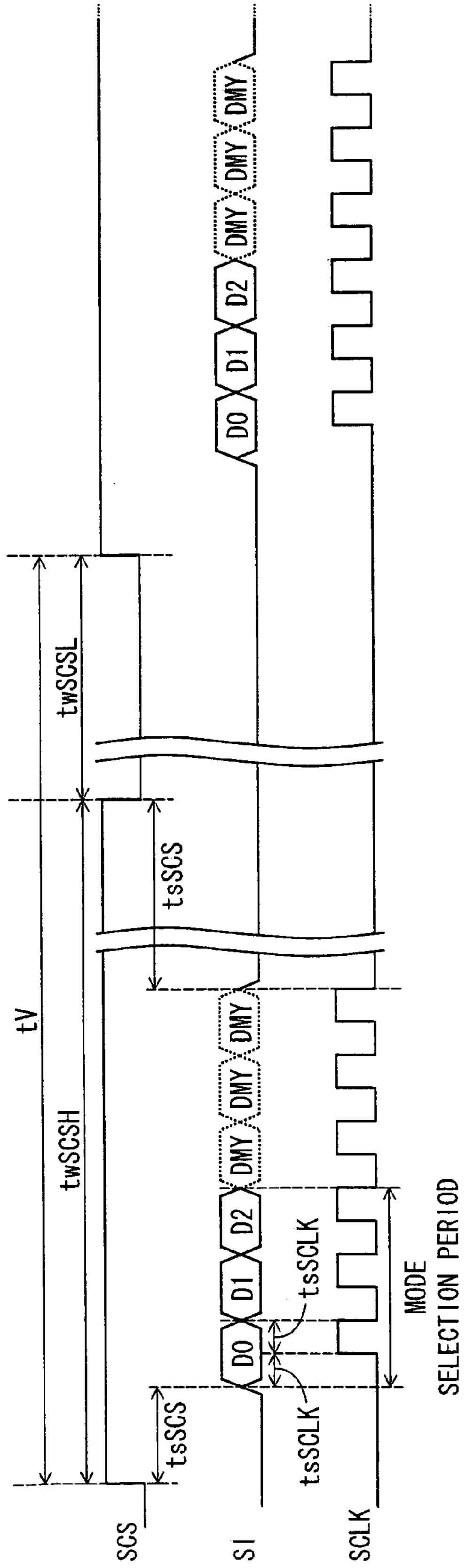
FIG. 3

The serial-parallel converter 25*a* is supplied with the serial data SI, the serial clock SCLK, and the serial chip select signal SCS from the flexible printed circuit 21*b*. As described above, the serial interface bus I/F BUS is a three-line type. Therefore, the serial data SI, the serial clock SCLK, and the serial chip select signal SCS are transmitted by different wires. FIGS. 2 and 3 show these signals.

The serial data SI is a signal configured as follows: Flags D0, D1, and D2, which are positioned in a mode selection period provided at the head of each frame are added to binary RGB digital image data arranged in serial.

In a data update mode as shown in FIG. 2 for writing image data into the pixel memory 30, image data sets in each of which RGB data for one horizontal display period are arranged in time series are arranged in the order of the horizontal display period. Further, a horizontal display period and a subsequent period have a horizontal blanking period therebetween, which horizontal blanking period includes (i) dummy data dR1, dG1, and dB1 . . . arranged therein and (ii) three dummy data DMY, DMY, and DMY arranged in a period corresponding to that of the flags D0, D1 and D2 of the initial horizontal display period. These dummy data may be High or Low.

In a display mode as shown in FIG. 3 for retaining image data stored in the pixel memory 30, all of the image data and the dummy data in the data update mode shown in FIG. 2 are substituted with the dummy data DMY.

The flag (second flag) D0 is a mode flag. In a case where the flag D0 is High, the flag D0 instructs the timing generator 25 to perform the data update mode for writing image data into the pixel memory 30. In a case where the flag D0 is Low, the flag D0 instructs the timing generator 25 to perform the display mode for retaining image data stored in the pixel memory 30. The flag (first flag) D1 is a frame inversion flag. In a case where the flag D1 is High, the flag D1 instructs the timing generator 25 to set the common output Vcom at High. In a case where the flag D1 is Low, the flag D1 instructs the timing generator 25 to set the common output Vcom at Low. That is, the flag D1 is a flag for specifying a polarity of the common output Vcom which is inverted every frame. The flag (third flag) D2 is an all clear flag. In a case where the flag D2 is High, the flag D2 instructs the timing generator 25 to write white display data into all pixels PIX at the current frame. In a case where the flag D2 is Low, the flag D2 instructs the timing generator 25 to write, into all of the pixels PIX, the image data to be supplied, at the current frame. That is, in the case where the flag D2 is High, the flag D2 gives an instruction for initializing display of all of the pixels PIX. The flag D2 is usually Low.

The serial clock SCLK is a synchronous clock for extracting various data including the flags of the serial data SI. The following describes an example of rise and fall timings of the serial clock SCLK. For each of the flags D0 to D2, the rise timing of the serial clock SCLK is a point of time when a time period tsSCLK has passed from a transmission start timing of the flag; for each of the image data R, G, and B, the rise timing of the serial clock SCLK is a point of time when a time period twSCLKL has passed from a transmission start timing of the image data. The time period tsSCLK is equal to the time period twSCLKL, and each of the time period tsSCLK and the time period twSCLKL is equal to a period in which the serial clock SCLK is Low. For each of the flags D0 to D2, the fall timing of the serial clock SCLK is a point of time when the time period tsSCLK has passed from the rise timing of the serial clock SCLK, and is a transmission end timing of the flag (that is, a timing at which switching to a next flag or next data occurs); for each of the image data R, G and B, the fall timing is a point of time when the time period twSCLKH has passed from the rise timing of the serial clock SCLK, and is a transmission end timing of the image data (that is, a timing at which switching to a next flag or next data occurs). The time period tsSCLK is equal to the time period twSCLKH, and each of the time period tsSCLK and the time period twSCLKH is equal to a period in which the serial clock SCLK is High. A duty cycle of the serial clock SCLK is 50% here.

The serial chip select signal SCS is a signal which becomes High for a time period twSCSH, in a case where the serial data SI and the serial clock SCLK are transmitted to the timing generator 25 from the CPU through the serial interface bus I/F BUS. In a frame for transmitting the serial data SI and the serial clock SLCK, the serial chip select signal SCS becomes High a time period tsSCS before a transmission start timing of the serial data SI, and becomes Low a time period thSCS after a transmission end timing of the serial data SI. Further, the serial chip select signal SCS becomes Low for a time period twSCSL after the High period. The time period twSCSH and the time period twSCSL constitute one frame period tV, which includes a vertical blanking period.

The image data written into the pixel memory 30 in the data update mode of FIG. 2 is retained in the display mode of FIG. 3. Both in the data update mode and in the display mode, the serial data SI have the flags D0, D1, and D2 added thereto, and the flag D1 is switched between High and Low every frame. Thus, the flag D1 is also a flag which specifies start of one frame.

From the serial data SI, the serial clock SCLK, and the serial chip select signal SCS supplied in this manner, the serial-parallel converter 25*a* extracts (i) the flags D0, D1, and D2 and (ii) data DR of R, data DG of G, and data DB of B. The flag D0 is used as the mode signal MODE, the flag D1 is used as a frame signal D1, and the flag D2 is used as the all clear signal ACL, for signal generation in other circuits. The data DR, DG, and DB are supplied to the data latch 23*b* of the binary driver 23.

Further, in accordance with the serial data SI, the serial clock SCLK, and the serial chip select signal SCS, the serial-parallel converter 25*a* generates the source clocks SCK and SCKB and the initial signal INI. The source clocks SCK and SCKB are supplied to the binary driver 23, and the initial signal INI is used for signal generation in another circuit.

Subsequently, in accordance with the mode signal MODE and the source clocks SCK and SCKB supplied from the serial-parallel converter 25*b*, the source start pulse generating section 25*b* generates a source start pulse SSP for an initial horizontal display period, and supplies the source start pulse SSP to the shift register 23*a* of the binary driver 23. The source start pulse SSP for the initial horizontal display period can be generated by use of a rise timing at which the mode signal MODE becomes High. Source start pulses SSP for a second horizontal display period and a subsequent horizontal display period can be generated by use of a second end bit END-BIT2 generated by an END-BIT holding section 25*c* (described later).

In accordance with an output of a final stage of the shift register 23*a* of the binary driver 23, the END-BIT holding section 25*c* generates a first end bit END-BIT 1 and the second END-BIT 2, and supplies the first end bit END-BIT 1 and the second end bit END-BIT 2 to the gate driver control signal generating section 25*d*. The first end bit END-BIT 1 is generated by further shifting the output of the final stage of the shift register 23*a* by a predetermined number of stages with use of a dummy shift register. The second end bit END-BIT 2 is generated by further shifting the first end bit END-BIT 1 by one stage with use of the dummy shift register.

In accordance with the first end bit END-BIT 1, the second end bit END-BIT 2, the mode signal MODE, and the all clear signal ACL, the gate driver control signal generating section 25*d* generates the gate clocks GCK1B and GCK2B, the gate start pulse GSP, and the gate enable signal GEN, and supplies the gate clocks GCK1B and GCK2B, the gate start pulse GSP, and the gate enable signal GEN to the gate driver 24.

Subsequently, in accordance with (i) the source start pulse SSP supplied from the source start pulse generating section 25*b* of the timing generator 25 and (ii) the initial signal INI supplied from the serial-parallel converter 25*a* of the timing generator 25, the shift register 23*a* of the binary driver 23 generates outputs of SRs at respective stages. The data latch 23*b* includes a first latch circuit 23*c* and an all clear circuit 23*d*. At output timings of SRs at respective stages in the shift register 23*a*, the first latch circuit 23*c* sequentially latches the data DR, DG, and DB supplied from the serial-parallel converter 25*a* of the timing generator 25, and outputs the latched data DR, DG and DB to their corresponding source lines SL (SL1 to SL96 for each of R, G, and B). In a case where the flag D2 of the serial data SI is High, upon reception of the active all clear signal ACL supplied from the serial-parallel converter 25*a* of the timing generator 25, the all clear circuit 23*d* outputs white display data to all of the source lines SL.

The gate driver 24 includes a shift register 24*a*, a plurality of buffers 24*b*, and a plurality of inversion buffers 24*c*. In accordance with (i) the gate clocks GCK1B and GCK2B, the gate start pulse GSP, and the gate enable signal GEN each of which is supplied from the gate driver control signal generating section 25*d* of the timing generator 25 and (ii) the initial signal INI supplied from the serial-parallel converter 25*a*, the shift register 24*a* generates outputs of SRs at respective stages. One of the buffers 24*b* and a corresponding one of the inversion buffers 24*c* make a pair, and such a pair is provided for each pixel line. Inputs of the buffer 24*b* and the inversion buffer 24*c* which make a pair are connected to an output of SR at a corresponding stage in the shift register 24*a*. An output of the buffer 24*b* is connected to a corresponding gate line GL (a corresponding one of GL1 to GL60), and an output of the inversion buffer 24*c* is connected to a corresponding gate line GLB (a corresponding one of GLB1 to GLB60).

In accordance with (i) the frame signal FRAME supplied from the serial-parallel converter 25*a* of the timing generator 25 and (ii) the power sources VDD and VSS, the Vcom driver 26 generates the common output Vcom, the black polarity output VA, and the white polarity output VB, and supplies the common output Vcom, the black polarity output VA, and the white polarity output VB to the active area 22.

Figure 7:
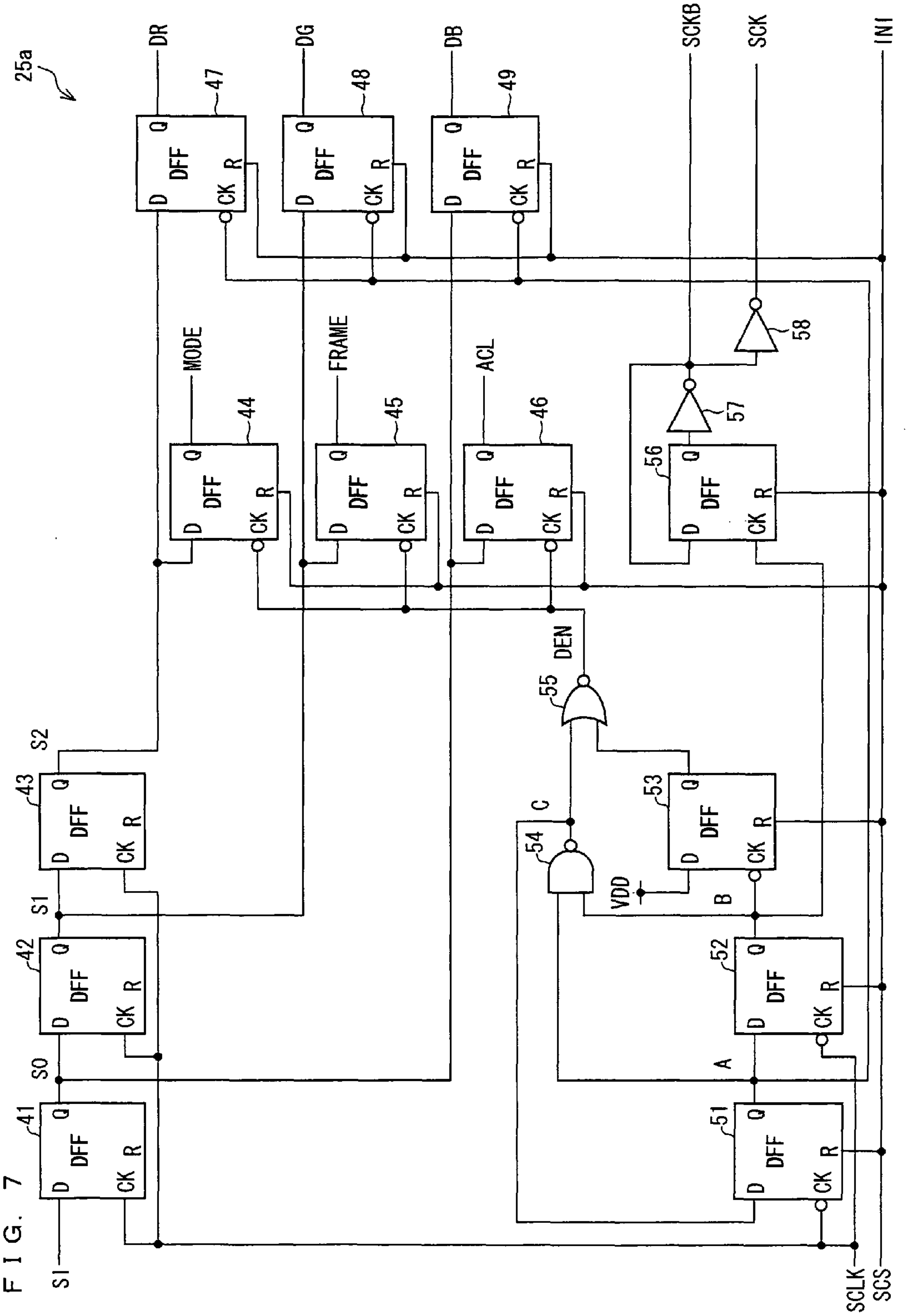
FIG. 7

FIG. 7 shows an example of a detailed configuration of the serial-parallel converter 25*a*.

The serial data SI passes through D flip-flops 41, 42, and 43 in order, which D flip-flops 41, 42, and 43 are connected in cascade. In a case where an output S2 of the D flip-flop 43 at the third stage passes through a D flip-flop 44, the mode signal MODE is extracted. In a case where an output Si of the D flip-flop 42 at the second stage passes through a D flip-flop 45, the frame signal FRAME is extracted. In a case where an output S0 of the D flip-flop 41 at the first stage passes through a D flip-flop 46, the all clear signal ACL is extracted. Assume that the image data are arranged in the order of R, G, and B in time series. In this case, in a case where the output S2 passes through a D flip-flop 47, the data DR is extracted; in a case where the output Si passes through a D flip-flop 48, the data DG is extracted; and in a case where the output S0 passes through a D flip-flop 49, the data DB is extracted.

The serial clock SCLK is inputted to High-active clock terminals CK of the D flip-flops 41, 42, and 43. An output DEN of a NOR gate 55 having two inputs is inputted to Low-active clock terminals CK of the D flip-flops 44, 45, and 46. An output A of a D flip-flop 51 is inputted to Low-active clock terminals CK of the D flip-flops 47, 48 and 49.

One of the inputs of the NOR gate 55 is connected to an output of a D flip-flop 53, and the other one of the inputs is connected to an output C of a NAND gate 54 having two inputs. An input of the D flip-flop 53 is connected to the power source VDD, and a Low-active clock terminal CK of the D flip-flop 53 is connected to an output B of a D flip-flop 52. One of the inputs of the NAND gate 54 is connected to the output B, and the other one of the inputs is connected to the output A. An input of the D flip-flop 51 is connected to the output C. An input of the D flip-flop 52 is connected to the output A. The serial clock SCLK is inputted to Low-active clock terminals CK of the D flip-flops 51 and 52.

The source clock SCKB is obtained by causing an output of a D flip-flop 56 to pass through an inverter 57.

The source clock SCK is obtained by causing an output of the inverter 57 to pass through an inverter 58. An input of the D flip-flop 56 is connected to the output of the inverter 57, and a High-active clock terminal CK of the D flip-flop 56 is connected to the output B.

In each of the D flip-flops, a positive edge trigger occurs on the High-active clock terminal CK, whereas a negative edge trigger occurs on the Low-active clock terminal CK.

The serial chip select signal SCS is inputted to a reset terminal R of each of the D flip-flops 44 to 53 and 56. The initial INI is the serial chip select signal SCS itself.

Figure 12:
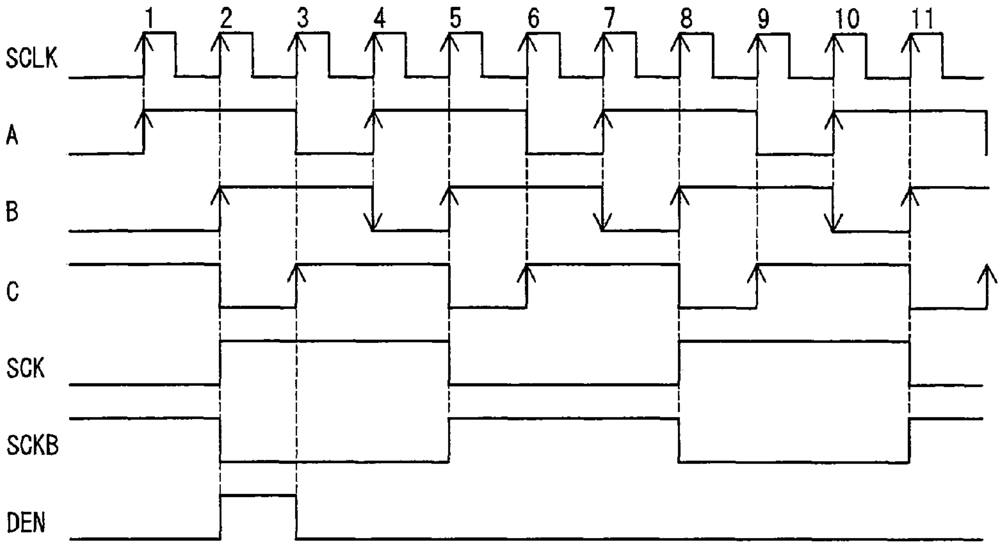
FIG. 12

FIG. 12 shows a timing chart illustrating respective waveforms of the serial clock SCLK, the outputs A, B, and C, the source clocks SCK and SCKB, and the output DEN.

Figure 8:
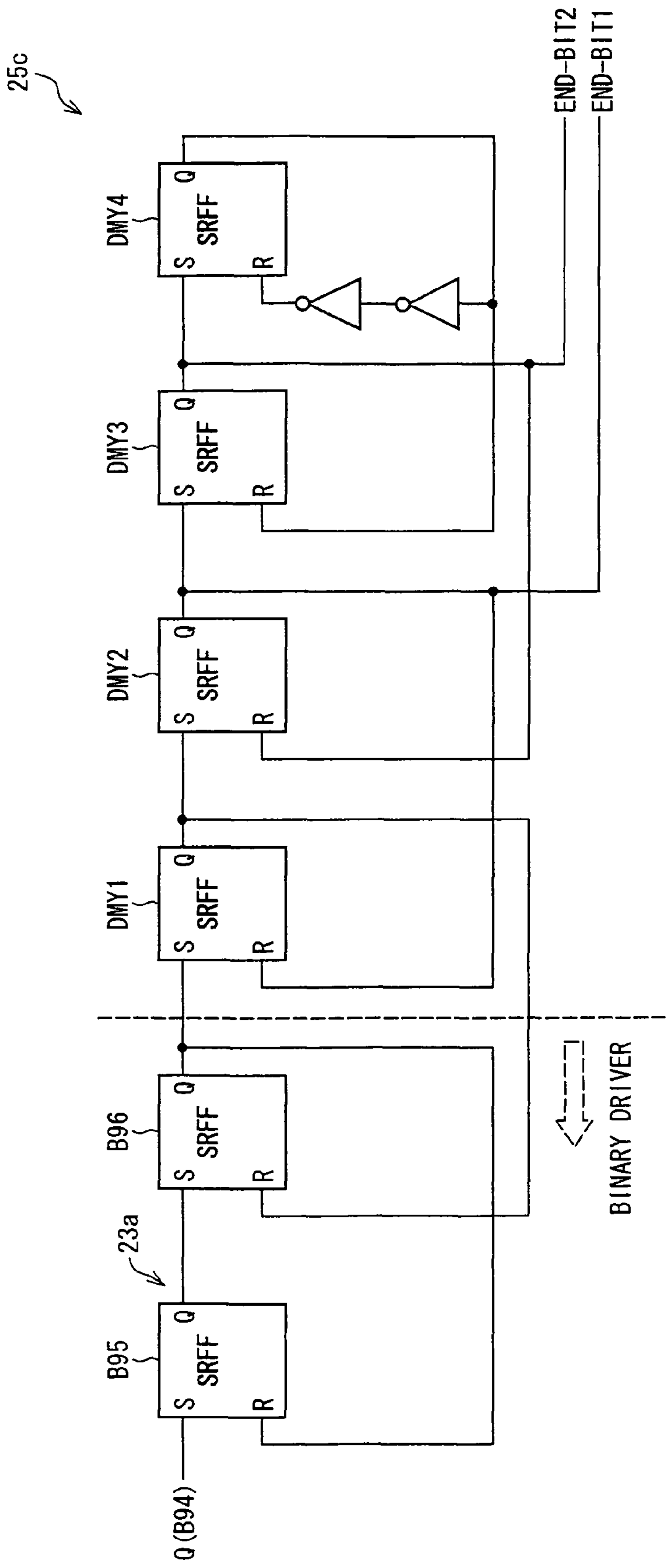
FIG. 8

FIG. 8 shows an example of a detailed configuration of the END-BIT holding section 25*c*.

The shift register 23*a* of the binary driver 23 includes set-reset flip-flops that are connected in cascade. FIG. 8 shows set-reset flip-flops B95 and B96, which are the last two ($95^{th}$ and $96^{th}$ stages) of the set-reset flip-flops. An output Q (B94) of a set-reset flip-flop B94 preceding the set-reset flip-flop B95 is supplied to a set input terminal of the set-reset flip-flop B95. The END-BIT holding section 25*c* includes dummy set-reset flip-flops DMY1, DMY2, DMY3, and DMY4 that are similarly connected in order in cascade, wherein the DMY1 is connected to the final stage of the shift register 23*a*. In these set-reset flip-flops, a set-reset flip-flop is supplied with an output of a next stage as a reset signal. However, the set-reset flip-flop DMY4 is supplied with, as a reset signal, a signal that is outputted by itself and is delayed by two inverters.

An output of the set-reset flip-flop DMY2 is obtained as the first end bit END-BIT 1, and an output of the set-reset flip-flop DMY3 is obtained as the second end bit END-BIT 2.

Figure 9:
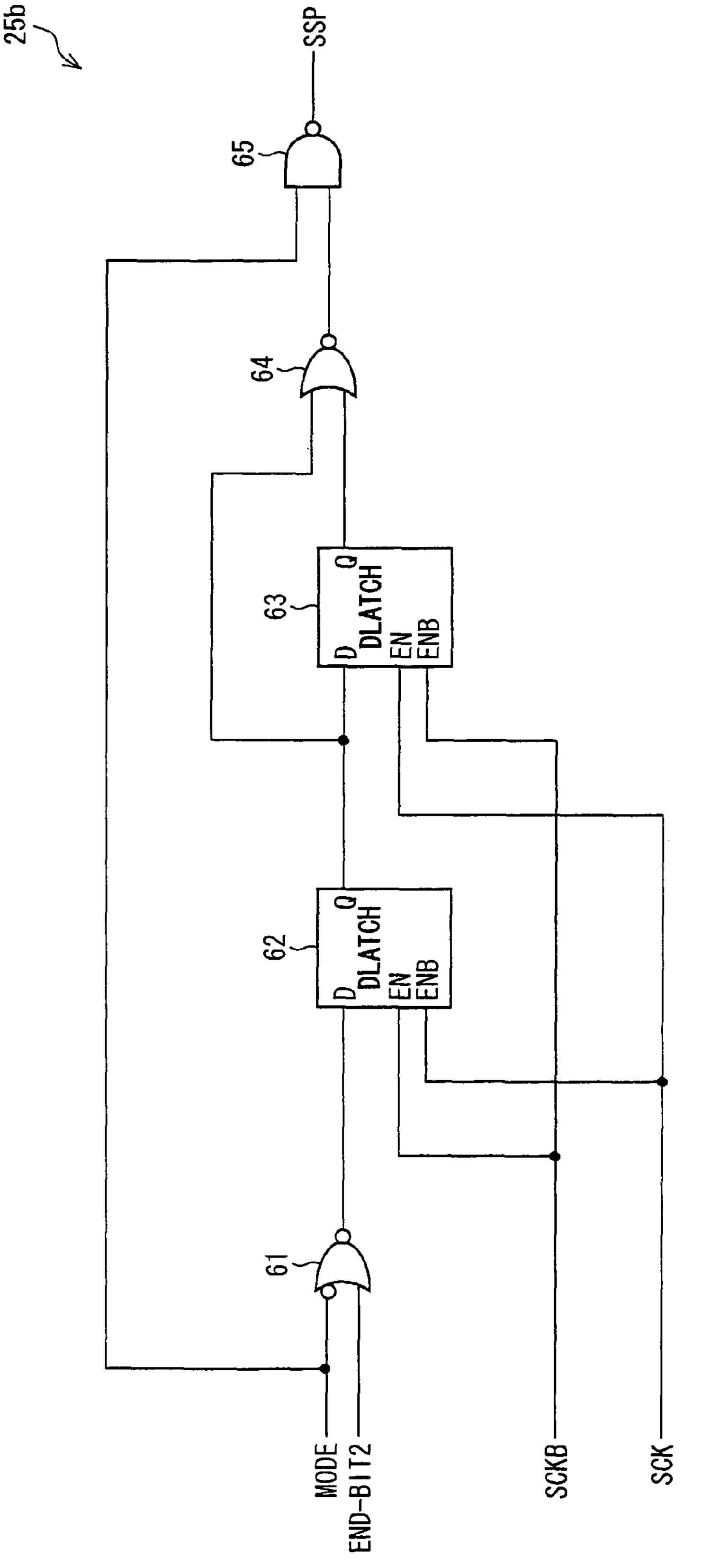
FIG. 9

FIG. 9 shows an example of a detailed configuration of the source start pulse generating section 25*b*.

The mode signal MODE is inputted to one (Low active) of two inputs of an NOR gate 61, and the second end bit END-BIT 2 is inputted to the other one (High active) of the inputs. An output of the NOR gate 61 is inputted to a D latch 62, and an output of the D latch 62 is inputted to a D latch 63. The source clock SCKB generated by the serial-parallel converter 25*a* is inputted to an enable terminal EN of the D latch 62 and an enable terminal ENB of the D latch 63. The source clock SCK generated by the serial-parallel converter 25*a* is inputted to an enable terminal ENB of the D latch 62 and an enable terminal EN of the D latch 63. Outputs of the D latches 62 and 63 are inputted to a NOR gate 64 having two inputs. An output of the NOR gate 64 and the mode signal MODE are inputted to a NAND gate 65 having two inputs, and an output of the NAND gate 65 serves as the source start pulse SSP.

Figure 10:
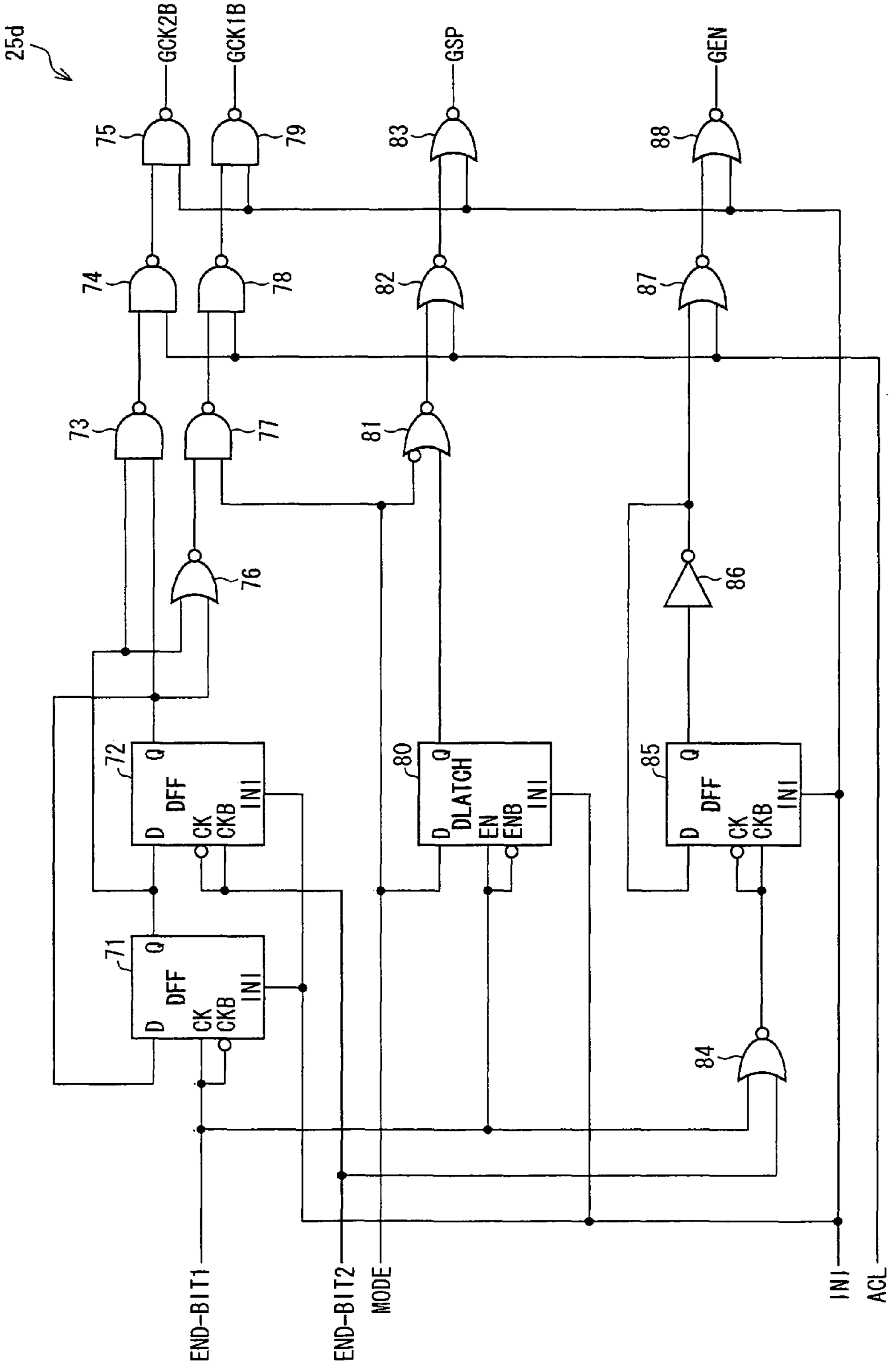
FIG. 10

FIG. 10 shows an example of a detailed configuration of the gate driver control signal generating section 25*d*.

The first end bit BND-BIT 1 is inputted to a High-active clock terminal CK and a Low-active clock terminal CKB of a D flip-flop 71. An output of the D flip-flop 71 is inputted to a D flip-flop 72. The second end bit END-BIT 2 is inputted to a Low-active clock terminal CK and a High-active clock terminal CKB of the D flip-flop 72. An output of the D flip-flop 72 is inputted to the D flip-flop 71. The outputs of the D flip-flops 71 and 72 are inputted to two inputs of a NAND gate 73 and to two inputs of a NOR gate 76. An output of the NAND gate 73 and the all clear signal ACL are inputted to a NAND gate 74 having two inputs. An output of the NAND gate 74 and the initial signal INI are inputted to a NAND gate 75 having two inputs. An output of the NAND gate 75 serves as the gate clock GCK2B.

An output of the NOR gate 76 and the mode signal MODE are inputted to a NAND gate 77 having two inputs. An output of the NAND gate 77 and the all clear signal ACL are inputted to a NAND gate 78 having two inputs. An output of the NAND gate 78 and the initial signal INI are inputted to a NAND gate 79 having two inputs. An output of the NAND gate 79 serves as the gate clock GCK1B.

The mode signal MODE is also inputted to a D latch 80. The first end bit END-BIT 1 is inputted to enable terminals EN and ENB of the D latch 80. An output of the D latch 80 is an input of a High-active terminal of a NOR gate 81 having two inputs, and the mode signal MODE is an input of a Low-active terminal of the NOR gate 81. An output of the NOR gate 81 and the all clear signal ACL are inputted to a NOR gate 82 having two inputs. An output of the NOR gate 82 and the initial signal INI are inputted to a NOR gate 83 having two inputs. An output of the NOR gate 83 serves as the gate start pulse GSP.

The first end bit END-BIT 1 and the second end bit END-BIT 2 are also inputted to a NOR gate 84 having two inputs. An output of the NOR gate 84 is inputted to a Low-active clock terminal CK and a High-active clock terminal CKB of a D flip-flop 85. An output of the D flip-flop 85 is inputted to an inverter 86, and an input of the D flip-flop 85 is connected to an output of the inverter 86. The output of the inverter 86 and the all clear signal ACL are inputted to a NOR gate 87 having two inputs. An output of the NOR gate 87 and the initial signal INI are inputted to an NOR gate 88. An output of the NOR gate 88 serves as the gate enable signal GEN.

The initial signal INI is inputted to respective initial terminals INI of the D flip-flops 71, 72, and 85 and the D latch 80. The D flip-flop 71 is a positive edge triggered type, and the D flip-flops 72 and 85 are a negative edge triggered type.

Figure 13:
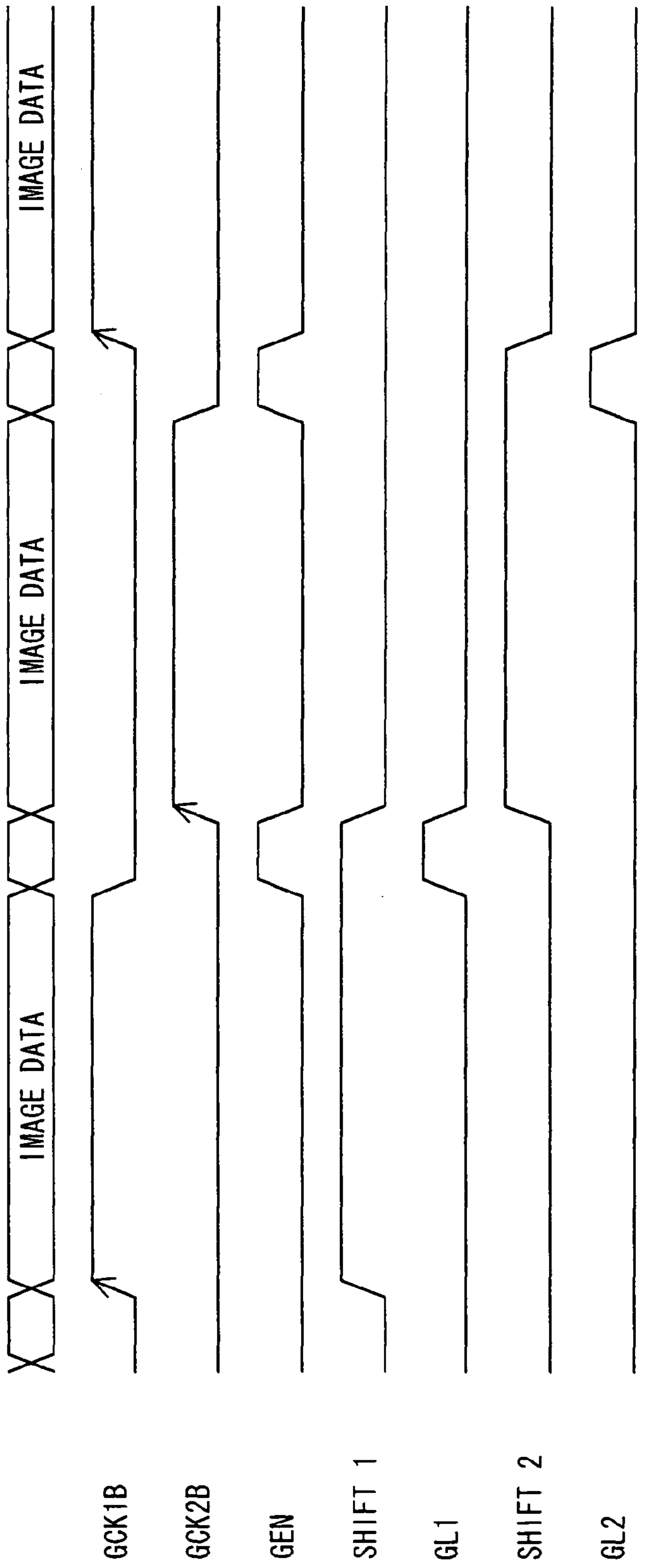
FIG. 13
Figure 14:
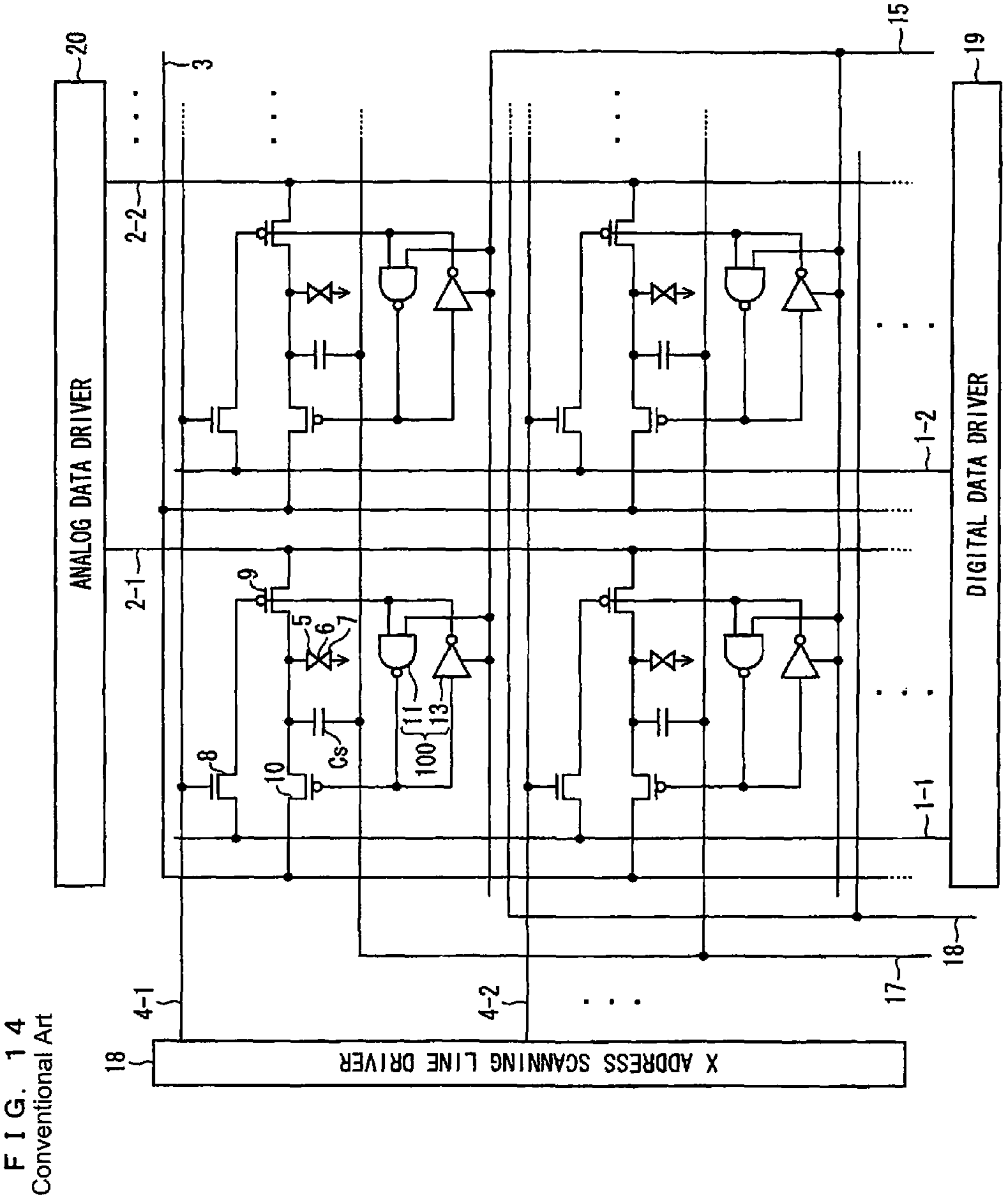
F I G . 1 4 Conventional Art
FIG. 14
Figure 15:
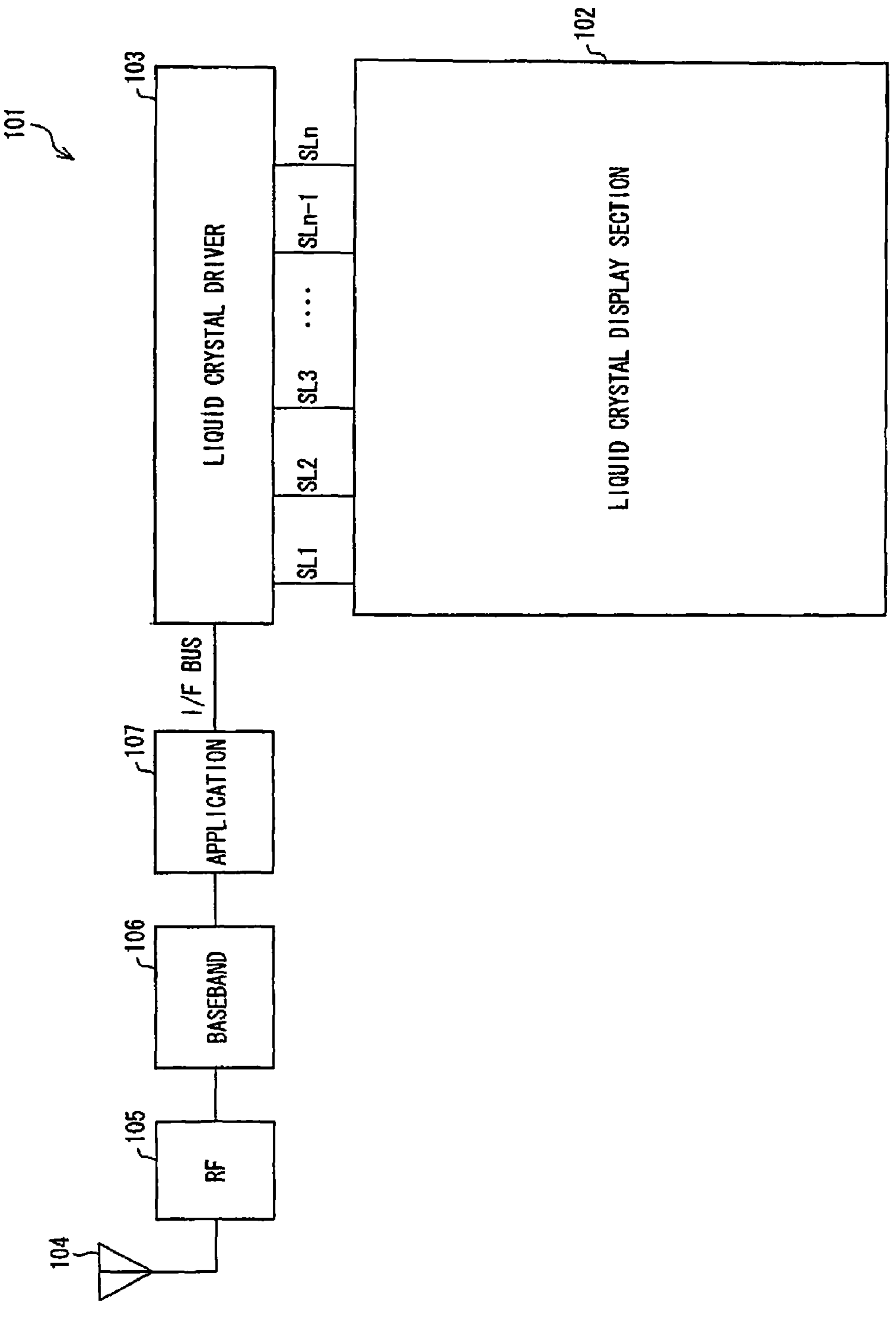
FIG. 15 Conventional Art
FIG. 15
Figure 16:
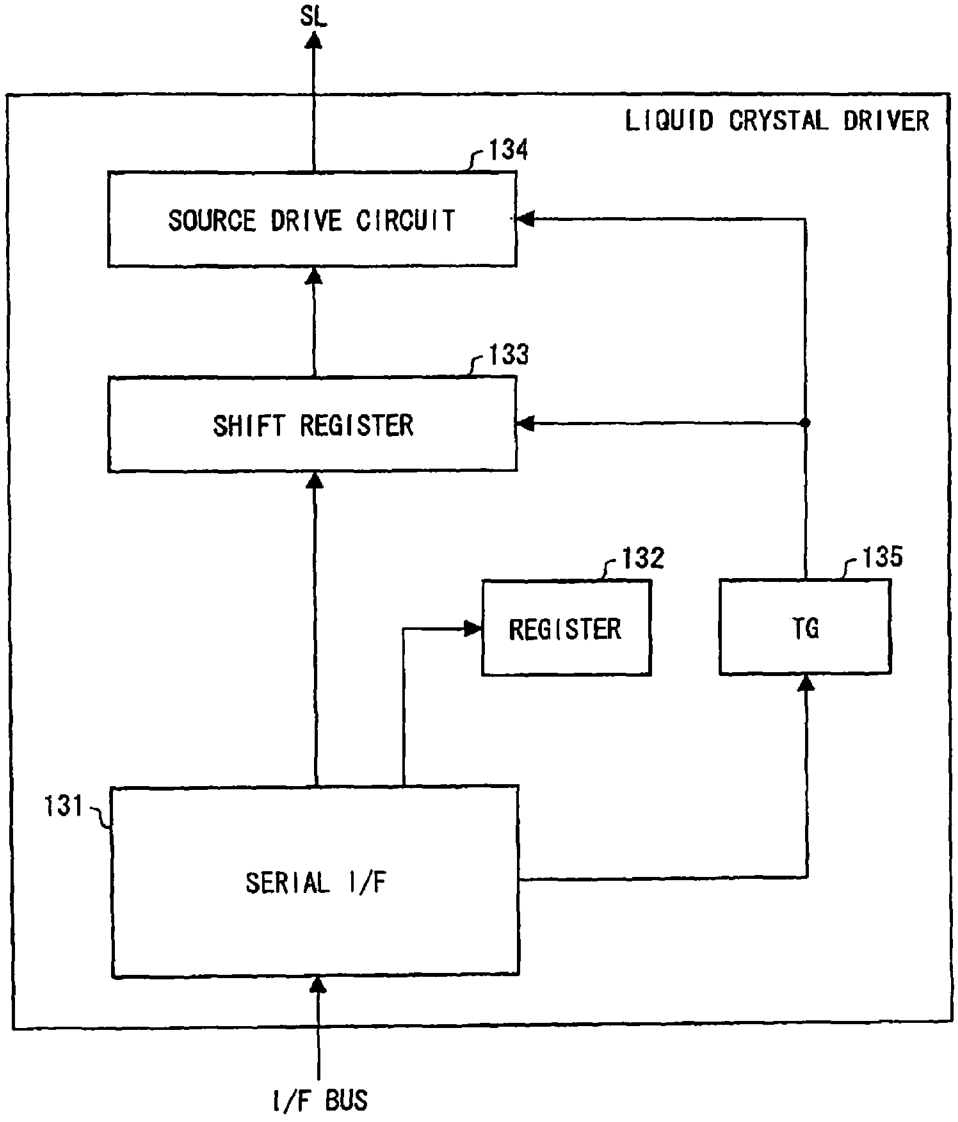
F I G. 16 Conventional Art
FIG. 16

A timing chart of FIG. 13 shows respective waveforms of the gate clocks GCK1B and GCK2B, the gate enable signal GEN, and the gate line outputs GL (GL1 and GL2). A shift 1 indicates a period in which data DR, DG, and DB for the first gate line output GL1 are outputted to the source line SL. A shift 2 indicates a period in which data DR, DG, and DB for the second gate line output GL2 are outputted to the source line SL. The image data are written into the pixel memory 30 at once by use of the gate enable signal GEN at the end of the horizontal display period. Therefore, even if fluctuation occurs in electric potential of the source line SL in a period in which the data DR, DG, and DB are outputted to the source line SL in order, this gives less effects on the pixel memory 30's storing the image data.

Figure 11:
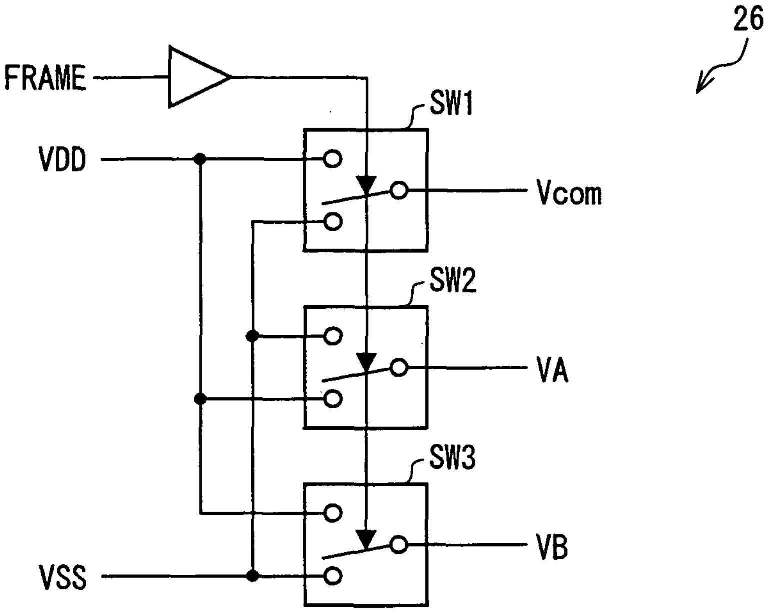
FIG. 11

FIG. 11 shows a detailed configuration of the Vcom driver.

The frame signal FRAME is inputted through a buffer as a control signal for switches SW1, SW2, and SW3, each of which corresponds to a change-over contact. The switch SW1 is a switch for outputting voltage for the common output Vcom; the SW2 switch is a switch for outputting voltage for the black polarity output VA; and the SW3 switch is a switch for outputting voltage for the white polarity output VB. Every time the frame signal FRAME is switched between High and Low, the switches SW1, SW2, and SW3 selects a power source so that (i) a combination of the power sources VDD, VSS, and VDD and (ii) a combination of the power sources VSS, VDD, and VSS are switched in turn.

As described above, the display device of the present embodiment is a display device of an active matrix type, and includes a display driver which is supplied with image data included in serial data by serial transmission, the serial data has a first flag for indicating start of one frame period added thereto, the display driver extracts the first flag and the image data from the serial data in accordance with a timing of a serial clock transmitted through a wire used for the serial transmission but different from a wire for the serial data, in accordance with a timing of the serial clock, the display driver generates a timing signal serving as a clock signal for operating a shift register of a data signal line driver included in the display driver, in accordance with the first flag and the timing signal serving as the clock signal for operating the shift register, the display driver generates a timing signal for an initial horizontal period in one frame period, and inputs the timing signal for the initial horizontal period to the shift register of the data signal line driver, in a case where a subsequent horizontal period exists, the display driver generates a timing signal for the subsequent horizontal period in accordance with a signal shifted by one horizontal display period by means of the shift register of the data signal line driver, and inputs the timing signal for the subsequent horizontal period to the shift register of the data signal line driver, in accordance with the signal shifted by one horizontal display period by means of the shift register of the data signal line driver, the display driver generates a timing signal to be inputted to a shift register of a scanning signal line driver included in the display driver, and in accordance with the timing signals for the initial horizontal period and the subsequent horizontal period, and a scanning signal supplied by the scanning signal line driver, the display driver writes the image data into pixels.

According to the foregoing configuration, the display driver extracts, in accordance with the timing of the serial clock, the first flag and the image data from the serial data supplied by the serial transmission. Then, the display driver generates the timing signal for the initial horizontal period in one frame period in accordance with the first flag, and inputs the timing signal to the shift register of the data signal line driver. The display driver sequentially generates timing signals for a second horizontal period and a subsequent horizontal period in accordance with the signal shifted by one horizontal display period by means of the shift register of the data signal line driver.

Thus, the display driver can generate, by direct control of the serial transmission, a timing signal for writing image data into a pixel. That is, the display driver can easily generate a timing signal without all the way using an oscillator and the like.

The above configuration makes it possible to easily generate, within a driver IC, a timing signal for writing image data into a pixel.

As described above, the display device of the present embodiment is a display device of an active matrix type, and includes a display driver to which image data included in serial data is supplied by serial transmission, the serial data has a first flag for specifying a polarity of voltage of a common electrode added thereto, the display driver extracts the first flag from the serial data in accordance with a timing of a serial clock transmitted through a wire used for the serial transmission but different from a wire for the serial data, and the display driver performs display in accordance with the serial data, while supplying the voltage of the common electrode which voltage has the polarity specified by the first flag extracted.

According to the above configuration, the display driver extracts, in accordance with the timing of the serial clock, the first flag from the serial data supplied by the serial transmission, determines the polarity of the voltage of the common electrode in accordance with the first flag, and performs display. Therefore, the display driver can generate a timing signal for AC common voltage by direct control of the serial transmission. This eliminates the need for an oscillator or a special control terminal for externally controlling generation of the timing signal for the AC common voltage, thereby allowing reduction in size of a circuit of the display driver.

The above configuration makes it possible to realize a display device capable of generating a timing signal for AC common voltage, while having a small circuit.

In the present embodiment, the flags D0, D1, and D2 are positioned at the head of a frame. However, the present invention is not limited to this. Alternatively, the flags can be positioned at a desired timing at which an instruction is to be given to the timing generator 25. For example, in order to switch the flag D1 between High and Low every period of integral multiple of a horizontal period, the flags can be positioned at the beginning of each horizontal period.

Further, in the present embodiment, the serial chip select signal SCS is used for generating various timing signals, but the serial chip select signal SCS is not always necessary. For example, instead of using the serial chip select signal SCS, the serial-parallel converter **25*a*** may be always set in a reception enabled state for serial data.

Furthermore, described in the present embodiment is a configuration in which the active area 22 includes the pixel memory 30. However, the present invention is not limited to this. The present invention is also applicable to a display device having an active area provided with no pixel memory, as long as the display device has a configuration in which a flag D0 does not distinguish a data update mode from a display mode.

In addition, the present embodiment has a configuration in which the shift register 23*a* of the binary driver 23 can perform shift operation merely in response to the source start pulse SSP supplied as a set input for the first stage. Therefore, the source clocks SCK and SCKB generated by the serial-parallel converter 25*a* are used for generating the source start pulse SSP in the source start pulse generating section 25*b*, so that the source clocks SCK and SCKB function as clock signals for operating the shift register of the data signal line driver. However, the present invention is not limited to this. The present invention can also have a configuration in which (i) the shift register of the data signal line driver performs shift operation in response to a clock signal supplied to each stage and (ii) the source clocks SCK and SCKB generated are used for generating the source start pulse SSP, and are inputted to each stage of the shift register of the data signal line driver so as to involve in operation of each stage of the shift register, so that the source clocks SCK and SCKB function as clock signals for operating the shift register of the data signal line driver.

The present invention is not limited to the description of the embodiments above, but may be altered by a skilled person within the scope of the claims. An embodiment based on a proper combination of technical means disclosed in different embodiments is encompassed in the technical scope of the present invention. For example, the present invention is applicable to an EL display device.

INDUSTRIAL APPLICABILITY

The present invention is suitably applicable to particularly a mobile terminal.

The invention claimed is:

1. A display device of an active matrix type, comprising:

a display driver which (i) includes a serial-parallel converter, a source start pulse generating section, and a gate driver control signal generating section and (ii) is configured to receive image data included in serial data by serial transmission, the serial data having a first flag for indicating whether the image data is written into pixels added thereto, the serial-parallel converter configured to extract the first flag and the image data from the serial data in accordance with a timing of a serial clock transmitted through a wire used for the serial transmission but different from a wire for the serial data, in accordance with the timing of the serial clock, the serial-parallel converter configured to generate a timing signal serving as a clock signal for operating a shift register of a data signal line driver included in the display driver, by use of the first flag and the timing signal serving as the clock signal for operating the shift register, the source start pulse generating section is configured to generate a timing signal for an initial horizontal period in one frame period, and input the timing signal for the initial horizontal period to the shift register of the data signal line driver, in a case where a subsequent horizontal period exists, the source start pulse generating section is configured to generate a timing signal for the subsequent horizontal period by use of a signal that is generated by shifting of a timing signal for a horizontal period immediately before the subsequent horizontal period by at least one horizontal display period by the shift register of the data signal line driver, and input the timing signal for the subsequent horizontal period to the shift register of the data signal line driver, by use of the signal that is generated by the shifting by the at least one horizontal display period by the shift register of the data signal line driver, the gate driver control signal generating section is configured to generate a timing signal to be inputted to a shift register of a scanning signal line driver included in the display driver, and in accordance with the timing signals for the initial horizontal period and the subsequent horizontal period, and a scanning signal supplied by the scanning signal line driver, the display device is configured to write the image data into pixels.

2. The display device as set forth in claim 1, wherein:

the pixels each include a pixel memory for storing the image data supplied by the display driver;

in a case where the pixel memory stores the image data, the serial data includes the image data to be stored in the pixel memory, and the serial data has the first flag added thereto; and in a case where the image data stored in the pixel memory is displayed, the serial data includes, instead of the image data to be stored in the pixel memory, dummy data not to be supplied to the pixels, and the serial data has the first flag added thereto.

3. The display device as set forth in claim 2, wherein:

the scanning signal is a signal which enables the image data to be written into the pixel memory after all of the image data are outputted to a data signal line in each horizontal display period.

4. The display device as set forth in claim 2, wherein:

in a case where the first flag indicates that the image data is written into the pixels, the display driver extracts the image data from the serial data and stores the image data in the pixel memory.

5. The display device as set forth in claim 2, wherein:

the serial data has a third flag giving an instruction as to whether to initialize display of all of the pixels added thereto; and the serial-parallel converter extracts the third flag from the serial data in accordance with a timing of the serial clock, and in a case where the instruction of the third flag is for initializing the display of all of the pixels, the display driver initializes the display of all of the pixels.

6. The display device as set forth in claim 1, wherein:

the serial data has a second flag for specifying a polarity of a voltage of a common electrode added thereto.

7. The display device as set forth in claim 1, wherein:

in the serial transmission, a serial chip select signal indicating a period during which the serial data is transmitted is transmitted through a wire different from the wires for the serial data and the serial clock.

8. The display device as set forth in claim 1, wherein:

the pixels each include an analog switch made of a CMOS circuit.

9. The display device as set forth in claim 8, wherein:

the display driver is monolithically provided in a display panel.

10. The display device as set forth in claim 1, wherein:

the pixels each include a display element using polymer dispersed liquid crystal.

11. The display device as set forth in claim 1, wherein:

the pixels each include a display element using polymer network liquid crystal.

12. The display device as set forth in claim 1, wherein:

the signal that is generated by the shifting by the at least one horizontal display period by the shift register of the data signal line driver is shifted by a first number of stages by use of a dummy shift register so that a first end bit is generated, and the first end bit is further shifted by one stage by the dummy shift register so that a second end bit is generated;

the source start pulse generating section generates the timing signal for the subsequent horizontal period for the data signal line driver by use of the second end bit; and the gate driver control signal generating section generates the timing signal to be inputted to the shift register of the scanning signal line driver by use of the first end bit and the second end bit.

13. A mobile terminal comprising a display device as set forth in claim 1, the display device serving as a display module.

14. A display device of an active matrix type, comprising:

a display driver which (i) includes a serial-parallel converter, a source start pulse generating section, and a gate driver control signal generating section and (ii) is configured to receive image data included in serial data by serial transmission, the serial data having a first flag for indicating whether or not the image data is written into pixels added thereto, the serial-parallel converter is configured to extract the first flag and the image data from the serial data in accordance with a timing of a serial clock transmitted through a wire used for the serial transmission but different from a wire for the serial data, in accordance with a timing of the serial clock, the serial-parallel converter is configured to generate a timing signal serving as a clock signal for operating a shift register of a data signal line driver included in the display driver, by use of the first flag and the timing signal serving as the clock signal for operating the shift register, the source start pulse generating section is configured to generate a timing signal for an initial horizontal period in one frame period, and input the timing signal for the initial horizontal period to the shift register of the data signal line driver, in a case where a subsequent horizontal period exists, the source start pulse generating section is configured to generate a timing signal for the subsequent horizontal period by use of a signal that is generated by shifting of a timing signal for a horizontal period immediately before the subsequent horizontal period by at least one horizontal display period by the shift register of the data signal line driver, and input the timing signal for the subsequent horizontal period to the shift register of the data signal line driver, by use of the signal that is generated by the shifting by the at least one horizontal display period by the shift register of the data signal line driver, the gate driver control signal generating section is configured to generate a timing signal to be inputted to a scanning signal line driver included in the display driver, and in accordance with the timing signals for the initial horizontal period and the subsequent horizontal period, and a scanning signal supplied by the scanning signal line driver, the display device is configured to write the image data into the pixels.

* * * * *